United States Patent [19]

Matsubara

[11] Patent Number: 6,133,761

[45] Date of Patent: Oct. 17, 2000

[54] LOGIC CIRCUIT

[75] Inventor: Gensoh Matsubara, Bunkyo-ku, Japan

[73] Assignee: Kabushiki Kaisha Toshiba, Kanagawa-ken, Japan

[21] Appl. No.: 08/961,369

[22] Filed: Oct. 30, 1997

[30] Foreign Application Priority Data

Oct. 30, 1996 [JP] Japan .................................... 8-288356

[51] Int. Cl.[7] .................................................. B65H 20/24
[52] U.S. Cl. ............................................. 326/112; 326/93
[58] Field of Search ................................... 326/17, 93, 95, 326/98, 112, 119, 121

[56] References Cited

U.S. PATENT DOCUMENTS

| 4,910,466 | 3/1990 | Kiuchi et al. ............................. 328/137 |
| 5,121,003 | 6/1992 | Williams . |
| 5,258,666 | 11/1993 | Furuki .................................... 307/449 |
| 5,808,483 | 9/1998 | Sako ....................................... 326/113 |

OTHER PUBLICATIONS

Matsubara, Gensoh & Nobuhiro Ide, "A Low Power Zero–Overhead Self–Timed Division and Square Root Unit Combining a Single–Rail Static Circuit with a Dual Rail Dynamic Circuit," Proceedings of Third International Symposium on Advanced Research in Asynchronous Circuits and Systems. IEEE Computer Society Press, Eindhoven, the Netherlands, 1997, pp. 198–209.

Matsubara and Ide, A Low Zero–Overhead Self–Times Division and Square Root Unit Combining a Single–Rail Static Circuit with a Dual–Rail Dynamic Circuit, IEEE computer society press, pp. 198–209, Apr. 1997.

Randy H. Katz, Contemporary Logic Design, 1994.

Katz, Randy H. "Contemporary Logic Design," The Benjamin/Cummings Publishing Company, Inc., Redwood City, CA; 1994; pp. 256–257 and 310–311.

*Primary Examiner*—Michael Tokar
*Assistant Examiner*—Anh Tran
*Attorney, Agent, or Firm*—Hogan & Hartson LLP

[57] ABSTRACT

Disclosed is a logic circuit of high speed operation, low power consumption and small circuit area. In the logic circuit, the power consumption is reduced without sacrificing the operation speed, by using dynamic asynchronous logic circuits of high speed and large power consumption only for the critical path of arithmetic operation and by using circuits (represented by static circuits) of low power consumption for the remaining portions at which high speed is not required. In this case, only when arithmetic operation is necessary, since the signal transition is given to only the synchronous circuit side, it is possible to reduce the power loss due to the wasteful signal transition. Further, where one bit signal is represented, for instance, although two signal lines are generally required for the dynamic asynchronous logic circuit, since only one signal line is used in the static circuit, it is possible to reduce the circuit area by reducing the quantity of wires.

21 Claims, 13 Drawing Sheets

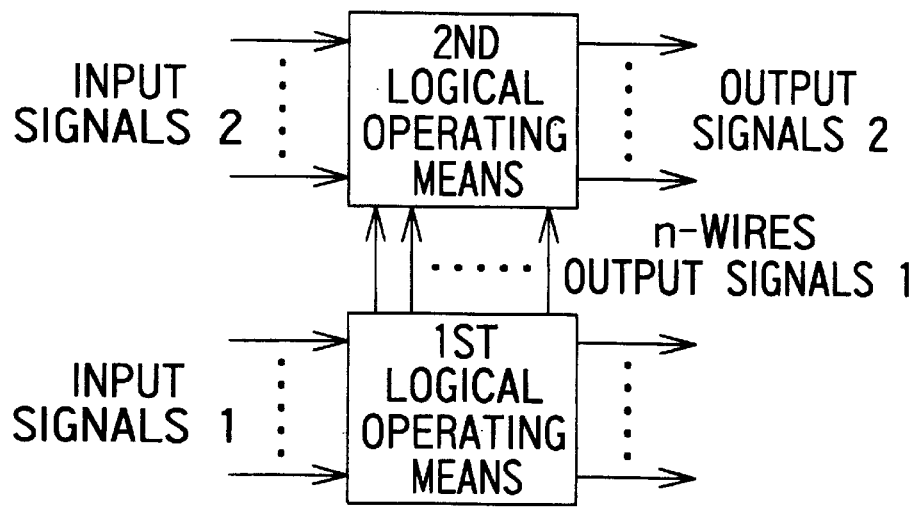
FIG. 1
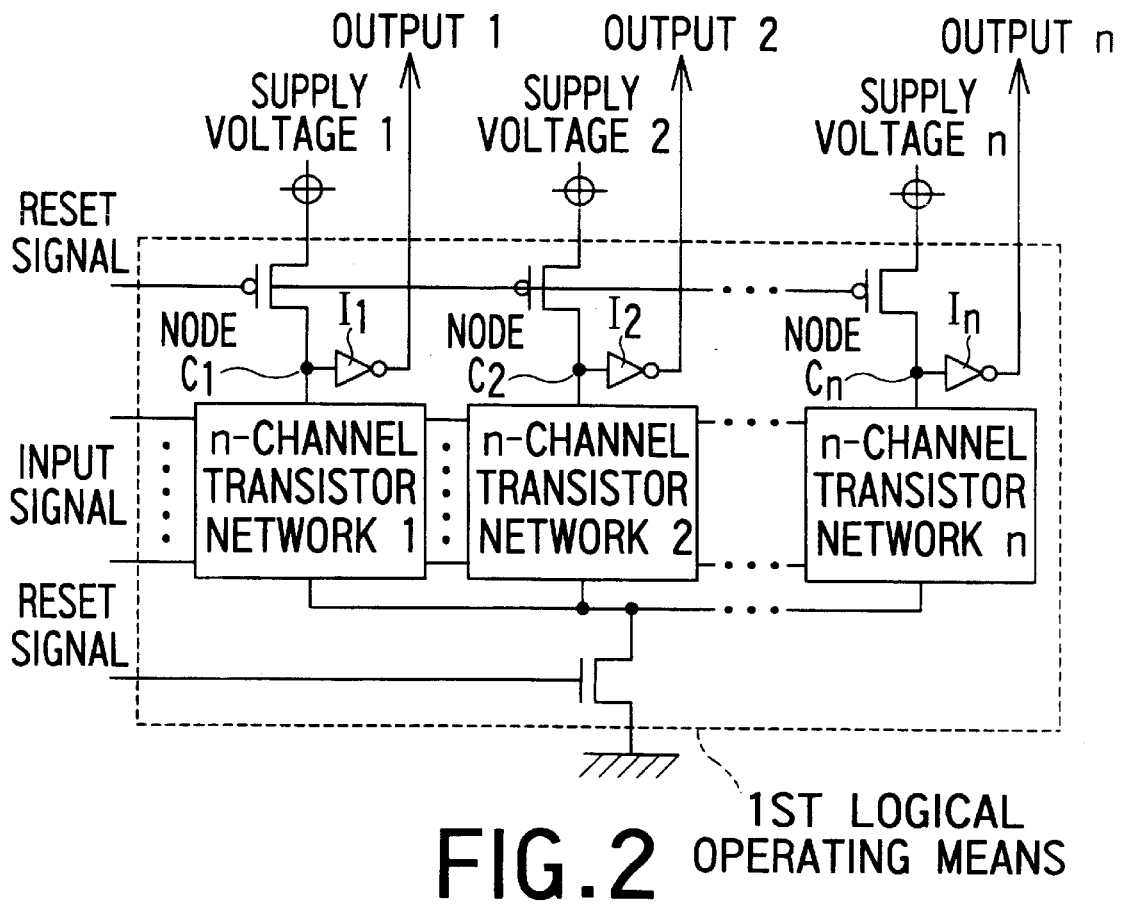
FIG. 2 1ST LOGICAL OPERATING MEANS

LOGIC CIRCUIT

BACKGROUND OF THE INVENTION

1. Field of the Invention

The present invention relates to a logic circuit, and more specifically to a logic circuit suitably applicable to an arithmetic circuit using MOS transistors, which can be operated at high speed and low power consumption, while decreasing the circuit area thereof.

2. Description of the Prior Art

It has been so far well known that an asynchronous logic circuit for outputting an arithmetic operation completion signal definitely by using dynamic circuits can execute arithmetic operation at a speed higher than that of the logic circuit using static circuits. An example of the asynchronous logic circuit is disclosed by a document [A Zero-Overhead Self-Timed 160-ns 54-b CMOS Divider] by T. E. Williams et al., (IEEE J. of Solid-State Circuits, Vol. 26, No. 11, pp. 1651 to 1661 (Nov. 1991).

FIG. 18 shows a schematic block diagram showing the dynamic type asynchronous logical gate. In this asynchronous logical gate, when a reset signal is applied to two resetting transistors $T_A$ and $T_B$, respectively, since two nodes X and XB are precharged, two circuit outputs Y and YB are reset to logical 0 via two inverters $I_A$ and $I_B$, so that this status is defined as an incompletion status of arithmetic operation. After this reset signal has been removed, when input signals are given to two n-channel pull-down networks $N_A$ and $N_B$ each composed of n-channel transistors, any one of the nodes X and XB precharged by the reset signal is discharged to the logic 0 through any one of the two n-channel pull-down networks. As a result, since any one of the outputs Y and YB changes to logic 1, the arithmetic operation is completed.

Therefore, when a two-input logical sum circuit is connected to the outputs Y and YB, if the output of the logical sum circuit changes to 1, it is possible to indicate the completion of the arithmetic operation definitely. Further, when the arithmetic operation has not been completed yet, since the two outputs Y and YB are both 0, even if these output signals are inputted to a succeeding-stage n-channel network (not shown), this n-channel network will not operate until any one of the outputs Y and YB changes to 1.

In other words, in the arithmetic circuit obtained by connecting a plurality of the arithmetic circuits in cascade as described above, since the valid arithmetic outputs can indicate the completion of the arithmetic operation and a start of operation of the succeeding stage n-channel network at the same time, the operation of the succeeding stage can be started simultaneously when the arithmetic operation of the present stage is completed, with the result that it is possible to realize an extremely high speed arithmetic circuit. In the case of the above-mentioned document, a plurality of the arithmetic circuits are connected in a ring-shape on the basis of the above-mentioned feature, and further a reset signal is supplied to the circuit by use of an arithmetic completion signal appropriately, in order to realize a high speed arithmetic circuit in which the processing time required for resetting is not at all needed.

However, a higher speed and a lower power consumption are both required year by year for the digital signal processor (DSP) and the microprocessor. On the other hand, conventionally, in the respective arithmetic circuits such as addition, subtraction, multiplication and division assembled in the digital signal processor or the microcomputer, the operation speeds of a division circuit and a square root arithmetic circuit for calculating data in accordance with an algorithm the same as that of the division circuit are particularly slow. In the practical arithmetic processing, however, since the number of times required for these arithmetic operations is relatively small, the processing speed of the whole processor is not often limited by the slow operation speeds of these division and the square root arithmetic circuits. Recently, however, with the rapid advance of image data processing, there exists a need of executing the division operation and the square root arithmetic operation at frequency much higher than is conventional, as with the case of the three-dimensional data processing, for instance. As the example of these processing, there are the square root operation for calculating a distance between two points in a three-dimensional space and the division operation for executing normalizing arithmetic operation of the distance thus obtained. Therefore, there exists a need of a logic circuit which can execute both the division and square root arithmetic processing at a high speed and low power consumption.

In the case of the prior art circuit as shown in FIG. 18, however, although the arithmetic operation speed is high, whenever the arithmetic operation is executed once, since the outputs Y and YB must be returned to 0 by resetting, even if the input signals for providing the same arithmetic results are given continuously, it is necessary to execute the same arithmetic operation again, with the result that the power consumption increases.

In contrast with this, in the case of the static circuits so far used widely, although the arithmetic operation speed is slow, as far as the input signals do not change, since the output signals are not at all changed, the power consumption at this interval is almost zero (although leak current exists). Further, in the case of the circuit as shown in FIG. 18, although two wires connected to the two outputs Y and YB are necessary in order to represent one-bit logical output signal, since only a single wire is necessary for the static circuit, it is possible to reduce the number of the wires.

As described above, in the case of the asynchronous logic circuit composed of dynamic circuits, although a high speed operation can be made, there exists a disadvantage such that the power consumption is large and the wiring quantity increases.

Therefore, it may be considered to form the synchronous circuit in such a way that static circuits are used only at the circuit portion where high speed operation is not required. In this case, however, when the signals of the static circuits are inputted to the dynamic asynchronous circuits, additional converter circuits are required, which can convert the output of the synchronous circuit to a signal form required on the dynamic circuit side. Therefore, even when both the circuits are simply combined with each other, the overhead of the hardware and the loss of the arithmetic time both increase, with the result that the merits of combining the synchronous circuits are canceled with each other.

SUMMARY OF THE INVENTION

With these problems in mind, therefore, it is the object of the present invention to provide means for realizing the maximum possible effect, by coupling the asynchronous circuits and synchronous circuits with each other by smallest possible additional hardware and further by constructing the circuit portions other than that for deciding the critical path (i.e., the portion for deciding the arithmetic time of the whole circuits) by use of the synchronous circuits.

Further, in the logic circuit according to the present invention, the construction is such that in the data to be supplied to the synchronous circuits, some data are supplied by asynchronous circuits at the portion for constructing the critical path and further, upon the arrival of the data from the asynchronous circuit, the synchronous circuit starts the arithmetic operation. Therefore, it is possible to reduce the number of times of spurious signal transitions in the synchronous circuits, so that the power consumption due to the signal transitions can be reduced, as compared with the construction composed of only the synchronous circuits.

To achieve the above-mentioned object, the present invention provides a logic circuit for representing logical values on the basis of high and low voltages, respectively, comprising: first logical operating means having n-units (where n is an integer larger than one) of output wires for outputting first logical operation results by transmitting any one of a first logical level and a second logical level according to a high voltage and a low voltage; when all the logical levels of n-units of the output wires are at the first logical level, said first logical operating means undeciding logical operation results, but when any one of n-units of the output wires is at the second logical level different from the first logical level, said first logical operating means deciding the first logical operation results on the basis of an output value corresponding to the output wire of the second logical level; and second logical operating means for inputting signals transmitted through n-units of the output wires and for outputting second logical operation results; when said first logical operating means undecides the logical operation results, said second logical operating means holding the second logical operation results, but when the first logical operation results are decided at a value, said second logical operating means outputting the second logical operation results corresponding to the decided value.

Here, it is preferable that said first logical operating means comprises asynchronous signal forming means for converting input logical signals of any predetermined form into a logical signal form required by said second logical operating means in synchronism with a command of signalling means for commanding operation start.

Further, it is preferable that said second logical operating means comprises n-units of n-channel MOS transistors; n-units of the output wires of said first logical operating means being connected to gate electrodes of n-units of said n-channel MOS transistors, respectively in such polarity that a logical value indicative of operation completion is at "1"; and all drain electrodes of n-units of said n-channel MOS transistors being connected to a junction point, and a logical value of an input signal applied to a source electrode of said n-channel MOS transistor of said second logical operating means selected according to the logical operation results of said first logical operating means being selected and outputted to the junction point.

Further, it is preferable that said second logical operating means comprises n-units of p-channel MOS transistors; n-units of the output wires of said first logical operating means being connected to gate electrodes of n-units of said p-channel MOS transistors, respectively in such polarity that a logical value indicative of operation completion is at "0"; and all drain electrodes of n-units of said p-channel MOS transistors being connected to a junction point, and a logical value of an input signal applied to a source electrode of said p-channel MOS transistor of said second logical operating means selected according to the logical operation results by said first logical operating means being selected and outputted to the junction point.

Further, it is preferable that said second logical operating means comprises n-units of transistor pairs such that drain electrodes and source electrodes of n-units of p-channel MOS transistors being connected to drain electrodes and source electrodes of n-units of n-channel MOS transistors, respectively; the logical operation results obtained by n-units of the output wires of said first logical operating means being inputted to gate electrodes of the p-channel MOS transistors of said transistor pairs in such polarity that a logical value indicative of operation completion is at "0"; the logical operation results obtained by n-units of the output wires of said first logical operating means being inputted to gate electrodes of the n-channel MOS transistors of said transistor pairs in such polarity that a logical value indicative of operation completion is at "1"; and all drain electrodes of n-units of said transistor pairs being connected to a junction point, and a logical value of an input signal applied to a source electrode of said transistor pairs of said second logical operating means selected according to the logical operation results by said first logical operating means being selected and outputted to the junction point.

Further, it is preferable that said second logical operating means comprises: two logic storage nodes; two n-channel MOS transistors having drain electrodes connected to said two logic storage nodes, respectively and gate electrodes connected to the output wires of said first logical operating means, respectively; potential maintaining means connected between said two logic storage nodes, for maintaining a node potential when the node potentials do not change but for setting an unchanged node potential to a potential complementary to a changed node potential when any one of the node potentials changes; and third logical operating means for applying potentials decided by input signals other than the signals inputted by said first logical operating means, to the two source electrodes of said two n-channel MOS transistors.

Here, it is preferable that said potential maintaining means are two p-channel MOS transistors having source electrodes connected to a supply voltage, a gate electrode of the one p-channel MOS transistor being connected to a drain of the other p-channel MOS transistor mutually, the drain electrodes thereof forming the two logic storage nodes, respectively.

Further, it is preferable that said potential maintaining means are two inverter circuits, an input terminal of one inverter circuit being connected to an output terminal of the other inverter circuit mutually, the input terminals thereof forming the two logic storage nodes, respectively.

Further, the present invention provides a logic circuit for representing a logical value on the basis of high and low voltages, comprising: first logical operating means having n-units (where n is an integer larger than one) of output wires for outputting first logical operation results by transmitting any one of a first logical level and a second logical level according to a high voltage and a low voltage; when all the logical levels of n-units of the output wires are at the first logical level, said first logical operating means undeciding logical operation results, but when any one of n-units of the output wires is at the second logical level different from the first logical level, said first logical operating means deciding the first logical operation results on the basis of an output value corresponding to the output wire of the second logical level; and second logical operating means for inputting signals transmitted through n-units of the output wires and for outputting second logical operation results; when said first logical operating means undecides the logical operation results, said second logical operating means holding the second logical operation results, but when the first logical operation results are decided at a value, said second logical operating means outputting the second logical operation results corresponding to the decided value, and wherein said first logical operating means comprises: n-units of nodes C corresponding to n-units of the output wires; n-units of p-channel MOS transistors for connecting n-units of the nodes C to a supply voltage; logic resetting means for undeciding the logical operating results of said first logical operating means by setting all logical levels of the output wires so constructed as to be influenced by the potentials at the nodes C to the first logical level, by charging potential levels at the nodes C to "1" when gate potential levels of said p-channel MOS transistors are at "0" level; logical evaluating means having n-channel MOS transistor network connected to n-units of the nodes C, for changing the potentials at the nodes C to "0" by discharging any one of the nodes in response to a signal inputted to said first logical operating means; and means for representing a decision of the first logical operation results by changing the logical level of the output wire corresponding to the node having a potential of "0" to the second logical level.

Further, the present invention provides a logic circuit composed of a plurality of cascade-connected logic circuit units for processing inputted logical signals by use of a plurality of operating means, wherein; each of a plurality of the logic circuit units for representing logical values on the basis of high and low voltages comprises: first logical operating means having n-units (where n is an integer larger than one) of output wires for outputting first logical operation results by transmitting any one of a first logical level and a second logical level according to a high voltage and a low voltage; when all the logical levels of n-units of the output wires are at the first logical level, said first logical operating means undeciding logical operation results, but when any one of n-units of the output wires is at the second logical level different from the first logical level, said first logical operating means deciding the first logical operation results on the basis of an output value corresponding to the output wire of the second logical level; and second logical operating means for inputting signals transmitted through n-units of the output wires and for outputting second logical operation results; when said first logical operating means undecides the logical operation results, said second logical operating means holding the second logical operation results, but when the first logical operation results are decided at a value, said second logical operating means outputting the second logical operation results corresponding to the decided value, and wherein said first logical operating means of the first-stage logic circuit unit of the logic circuit comprises asynchronous signal forming means for converting input logical signals of any predetermined form into a logical signal form required by said second logical operating means in synchronism with a command of signalling means for commanding operation start.

Further, the present invention provides a logic circuit composed of a plurality of ring-connected logic circuit units for performing iterative operations a predetermined number of times, wherein; each of a plurality of the logic circuit units for representing logical values on the basis of high and low voltages comprises: first logical operating means having n-units (where n is an integer larger than one) of output wires for outputting first logical operation results by transmitting any one of a first logical level and a second logical level according to a high voltage and a low voltage; when all the logical levels of n-units of the output wires are at the first logical level, said first logical operating means undeciding logical operation results, but when any one of n-units of the output wires is at the second logical level different from the first logical level, said first logical operating means deciding the first logical operation results on the basis of an output value corresponding to the output wire of the second logical level; and second logical operating means for inputting signals transmitted through n-units of the output wires and for outputting second logical operation results; when said first logical operating means undecides the logical operation results, said second logical operating means holding the second logical operation results, but when the first logical operation results are decided at a value, said second logical operating means outputting the second logical operation results corresponding to the decided value, and wherein said logic circuit further comprises: operation completion detecting means for detecting operation completion signals of the output wires of said first logical operating means; and reset signal forming means for requesting a reset for the logic circuit unit stage related to formation of an input signal applied to the logic circuit unit stage whose operation has been completed by use of the operation completion signal and for requesting a reset release for the already reset logical operating means.

In the logic circuit according to the present invention, since the static type synchronous circuits of small power consumption and less wiring quantity and the dynamic type asynchronous circuits of high operation speed (although the power consumption is large as compared with the static circuits) are appropriately combined with each other, it is possible to realize a logic circuit provided with a high speed operation of the dynamic circuits and with a low power consumption and small circuit area of the static circuits. Further, when compared with the logic circuit of simple static circuits, since the arithmetic operation can be started only at the stage where data necessary for arithmetic operation are all prepared, it is possible to suppress the wasteful status transition and thereby the wasteful power consumption. For instance, when the logic circuit according to the present invention is applied to a divider, the power consumption can be reduced as much as about 60%, as compared with that of the conventional divider. This is because the spurious transitions are not at all generated in the dividing operation, so that the wasteful circuit operation can be eliminated.

BRIEF DESCRIPTION OF THE DRAWINGS

FIG. 1 is a schematic block diagram showing a basic construction of the logic circuit according to the present invention;

FIG. 2 is a schematic block diagram showing a practical circuit construction of the first logical operating means of the logic circuit according to the present invention;

DETAILED DESCRIPTION OF THE PREFERRED EMBODIMENTS

Figure 3:
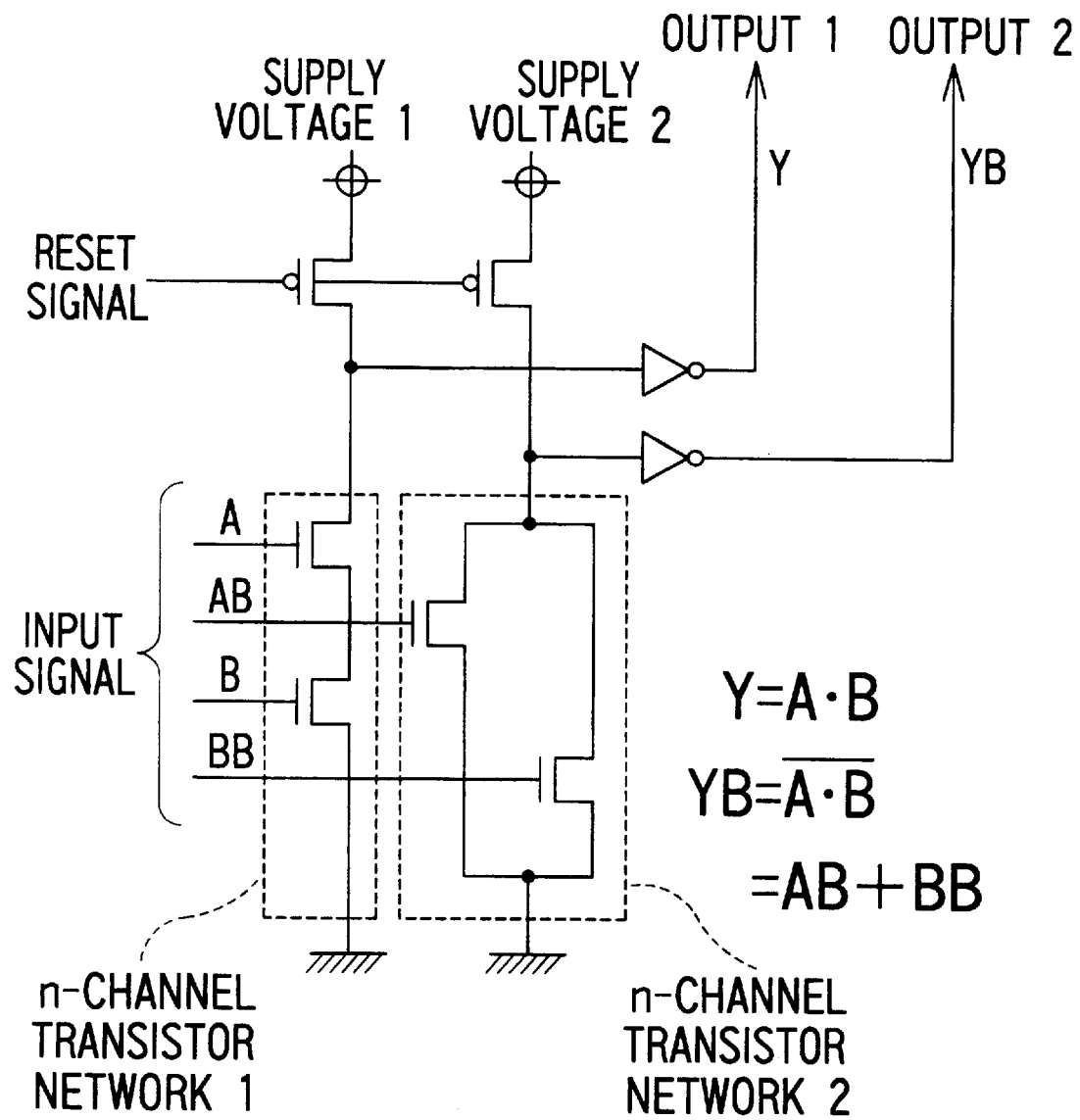
FIG. 3 is a schematic block diagram showing a practical circuit example of the n-channel transistor network shown in FIG. 2.

Some embodiments of the logic circuit according to the present invention will be described hereinbelow with reference to the attached drawings.

FIG. 1 is a schematic block diagram showing the basic construction of the logic circuit according to the present invention. In FIG. 1, the logic circuit is composed of first logical operating means and second logical operating means. First input signals 1 are inputted to the first logical operating means. When the arithmetic operation of the first logical operating means has not been completed, the first output signals 1 of the first logical operating means are all at logical value 0, for instance. However, at the time when the arithmetic operation of the first logical operating means ends, one of n-units of the signal lines changes to logical value 1.

In contrast with this, in the case of the second logical operating means, when the arithmetic operation of the first logical operating means has not been completed; that is, when the logical values of the first output signals 1 are all 0, the second logical operating means holds the preceding operation result and further outputs second output signals 2 simultaneously. Upon completion of the arithmetic operation of the first logical operating means, the second operating means executes the arithmetic operation and further outputs the operated results as the second output signals 2.

Further, when the first arithmetic operating means is reset to return all the first output signals 1 to the logical value 0 for the succeeding arithmetic operation, the second logical operating means holds the preceding arithmetic results, without changing the second output signals 2 until the first logical operating means completes the arithmetic operation.

In other words, in the decision theoretic arithmetic operation mode such as [upon receiving the arithmetic results of the first logical operating means, the second logical operating means outputs significant arithmetic results], even if the second input signals 2 applied to the second logical operating means change, the second output signals 2 of the second logical operating means will not change until the first logical operating means completes the arithmetic operation. Accordingly, since the meaningless status transitions of the second output signals 2 can be eliminated, it is possible to simultaneously reduce the power consumption of other circuits to be driven by these meaningless status transitions.

FIG. 2 is a schematic block diagram showing a practical construction of the first logical operating means of the logic circuit according to the present invention shown in FIG. 1. In FIG. 2, nodes $C_1$ to $C_n$ are formed in correspondence to n-units of the first output signals 1. Further, when the reset signal is set to potential 0, since the nodes $C_1$ to $C_n$ are precharged by supply voltages 1 to n; that is, since the potential at each node is charged to 1, each of the outputs 1 to n is reset to potential 0 via each of inverters $I_1$ to $I_n$. This status is defined as incompletion status of arithmetic operation.

Successively, when the reset signal is set to potential 1, since any one of the n-channel transistor networks 1 to n decided by the input signal becomes conductive, any one of the nodes $C_1$ to $C_n$ corresponding thereto is discharged through the network down to potential 0. As a result, any one of the outputs 1 to n connected to each inverter is set to potential 1, so that a valid logical value can be represented and further the second logical operating means shown in FIG. 1 can be driven.

FIG. 3 is a schematic block diagram showing a practical example of the n-channel transistor network shown in FIG. 2. In the network as shown in FIG. 3, the network is constructed in such a way that a charge charged at each node can be discharged to the ground potential in response to a specific input signal.

Figure 4:
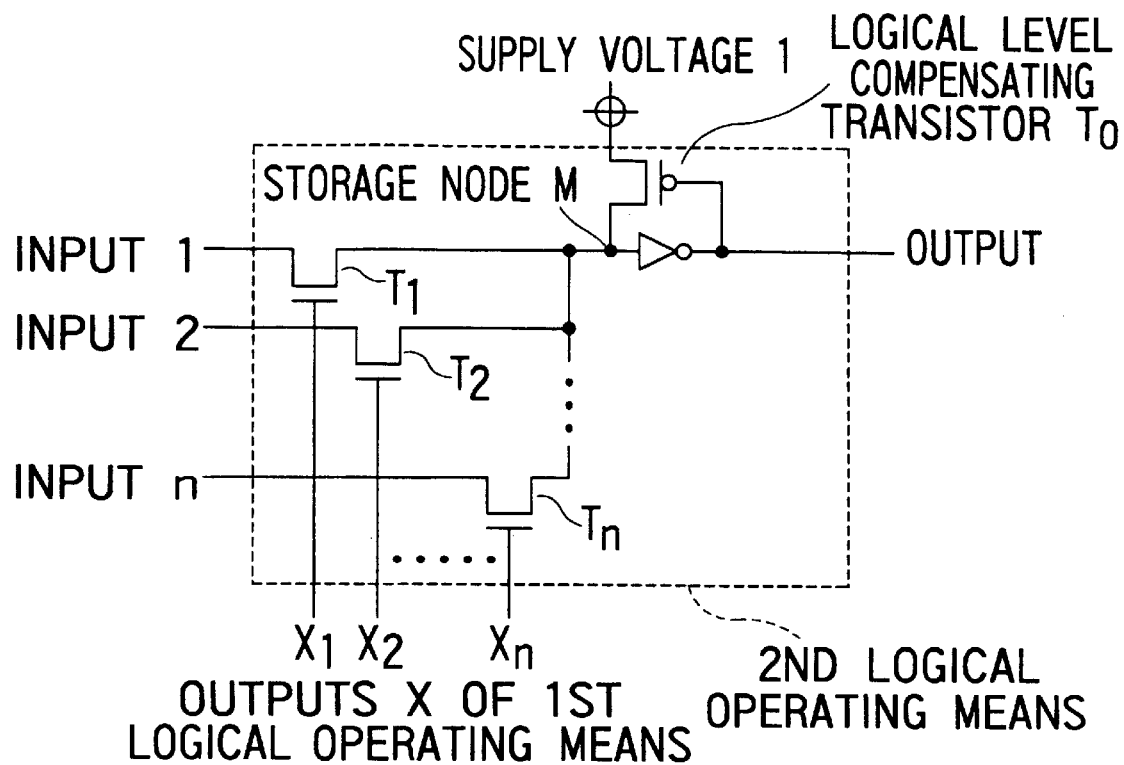
FIG. 4 is a schematic block diagram showing a practical circuit construction of the second logical operating means of the logic circuit according to the present invention.

FIG. 4 is a schematic block diagram showing a practical example of the second logical operating means of the logic circuit according to the present invention shown in FIG. 1. In this circuit, the outputs X of the first logical operating means (not shown) are constructed by n-units of wires $X_1$ to $X_n$. Now, when the first logical operating means (not shown) has not been completed the arithmetic operation yet, the outputs $X_1$ to $X_n$ of the first logical operating means are all potential 0, respectively as already explained. Therefore, the inputs 1 to n are not connected to a storage node M shown in FIG. 4, so that the potential at the storage node M can be held, without changing the output value of the second logical operating means.

Successively, when the first logical operating means (not shown) completes the arithmetic operation and thereby one of the outputs $X_1$ to $X_n$ of the first logical operating means changes to potential 1, one of n-channel MOS transistors $T_1$ to $T_n$ becomes conductive. That is, one of the inputs 1 to n is selected and thereby connected to the storage node M. Therefore, since the potential at the storage node M changes, the arithmetic results of the second logical operating means is outputted. Further, when the first logical operating means (not shown) changes to the incompletion status of the arithmetic operation, since all the outputs $X_1$ to $X_n$ of the first logical operating means are at potential 0, the storage node M is disconnected from the inputs 1 to n again, so that the preceding arithmetic results can be held.

Here, the advantageous point of the logic circuit constructed as described above is as follows: it is possible to construct effective hardware by burying data related to the completion of the arithmetic operation of the first arithmetic operating means definitely in the arithmetic result signals thereof and by switching the data storage and/or processing during the arithmetic operation corresponding thereto, without simply selecting the presence or absence of the data processing of the second logical operating means according to the validity and/or invalidity of the arithmetic results of the first logical operating means.

Further, in the circuit shown in FIG. 4, the output thereof is feedbacked to the storage node M through a logical level compensating transistor To' formed of a p-channel MOS transistor. By doing this, it is possible to compensate for a potential drop caused by the n-channel MOS transistors $T_1$ to $T_n$ each connected to each of the outputs $X_1$ to $X_n$ of the first logical operating means. In addition, it is possible to suppress static leakage current flowing through an inverter buffer connected to the storage node M.

Figure 5:
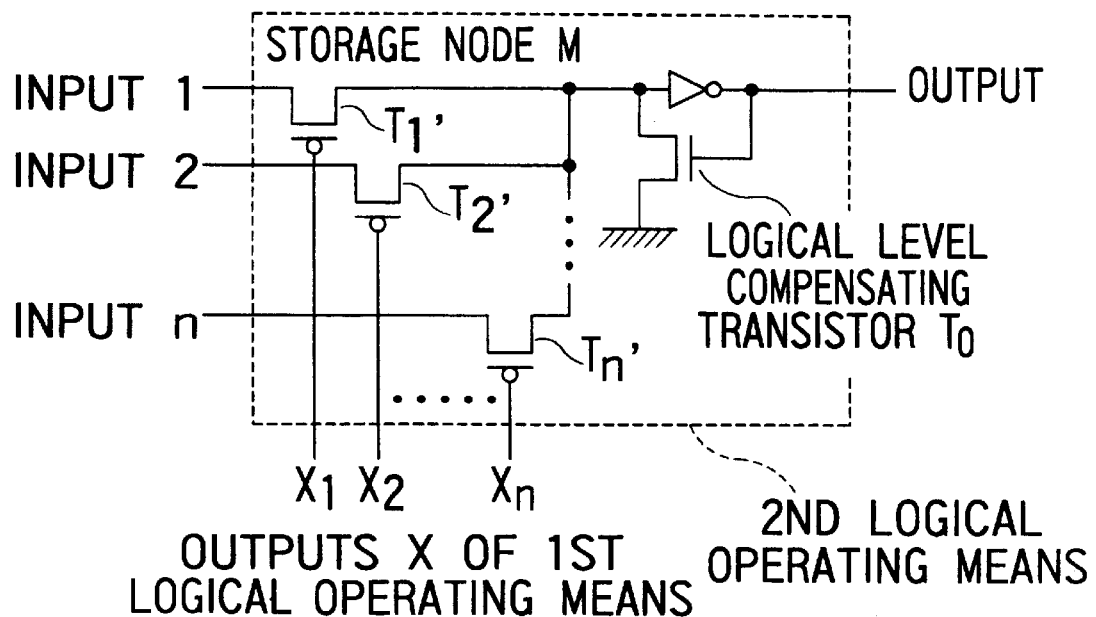
FIG. 5 is a schematic block diagram showing a first modification of the second logical operating means of the logic circuit according to the present invention.

FIG. 5 is a schematic block diagram showing a first modification of the second logical operating means of the logic circuit according to the present invention. In this circuit, when the arithmetic operation has not been completed, the potentials of the outputs $X_1$ to $X_n$ of the first logical operating means (not shown) are set to potential 1. However, when the arithmetic operation has been completed, any one of the potentials of the outputs $X_1$ to $X_n$ of the first logical operating means (not shown) is set to potential 0. Further, p-channel MOS transistors $T_1'$ to $T_n'$ are arranged instead of the n-channel MOS transistors $T_1$ to $T_n$ shown in FIG. 4. In the circuit as shown in FIG. 5, it is possible to obtain the same operation as with the case of the circuit shown in FIG. 4. In this circuit, however, since the logical level compensating transistor To is of n-channel MOS transistor, it is preferable to ground the source electrode of this n-channel MOS transistor down to potential 0.

Figure 6:
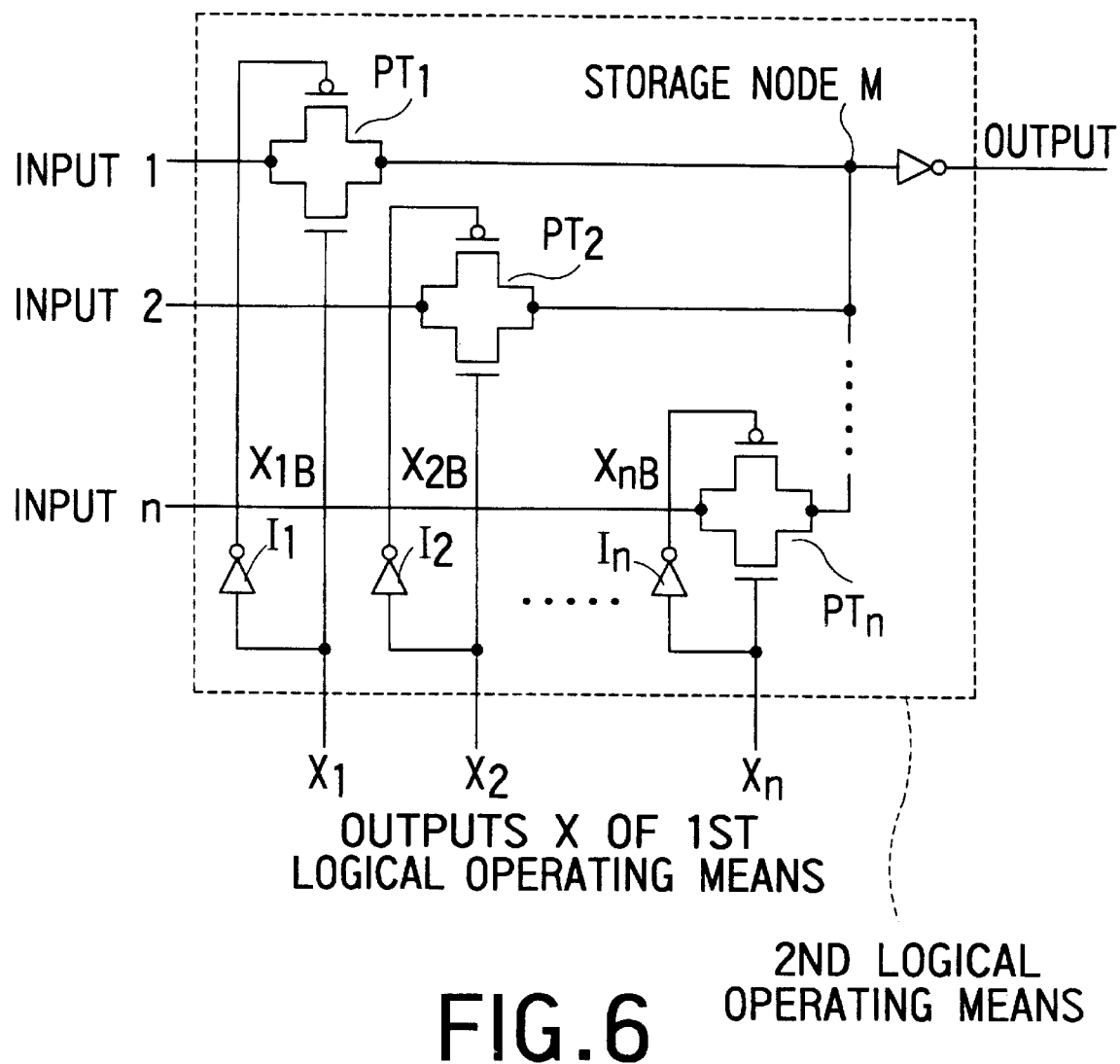
FIG. 6 is a schematic block diagram showing a second modification of the second logical operating means of the logic circuit according to the present invention.

FIG. 6 is a schematic block diagram showing a second modification of the second logical operating means of the logic circuit according to the present invention. In this circuit, although the outputs X of the first logical operating means (not shown) are constructed by n-units of wires $X_1$ to $X_n$ inversion output signals $X_{1B}$ to $X_{nB}$ of the output signals $X_1$ to $X_n$ n are also formed through inverters $I_1$ to $I_n$ respectively. Now, when the first logical operating means (not shown) does not complete the arithmetic operation, all the outputs $X_1$ to $X_n$ of the first logical operating means are at potential 0 and thereby all the inversion outputs $X_{1B}$ to $X_{nB}$ are at potential 1. Therefore, path transistor circuits $PT_1$ to $PT_n$ each formed by connecting n-channel and p-channel MOS transistors in parallel to each other and responsive to each of these output signals, respectively are not conductive. Further, since the storage node M is not connected to any of the inputs 1 to n, the potential at the storage node M is held, without changing the output of the second logical operating means.

Successively, when the first logical operating means (not shown) completes the arithmetic operation, any one of the outputs $X_1$ to Xn of the first logical operating means is at potential 1 and thereby any one of the inversion outputs $X_{1B}$ to $X_{nB}$ corresponding thereto changes to potential 0, so that any one of the path transistors $PT_1$ to $PT_n$ corresponding thereto becomes conductive. Therefore, since any one of the inputs 1 to n is connected to the storage node M, the potential at the storage node M changes according to the logical value of the input, so that the arithmetic results of the second logical operating means can be outputted. Further, when the first logical operating means (not shown) shifts to the incompletion status of the arithmetic operation, the storage node M is disconnected from the first inputs 1 to n again, so that the preceding arithmetic results thereof can be held.

Here, in the circuit shown in FIG. 6, being different from the circuit as shown in FIGS. 4 or 5, since the path transistors each obtained by connecting p-channel and n-channel transistors in parallel to each other are used, the potential at the storage node M is not subjected to the potential drop of the transistors. Therefore, there exists such an advantage that the logical level compensating transistor as shown in FIGS. 4 or 5 is not necessary.

Figure 7:
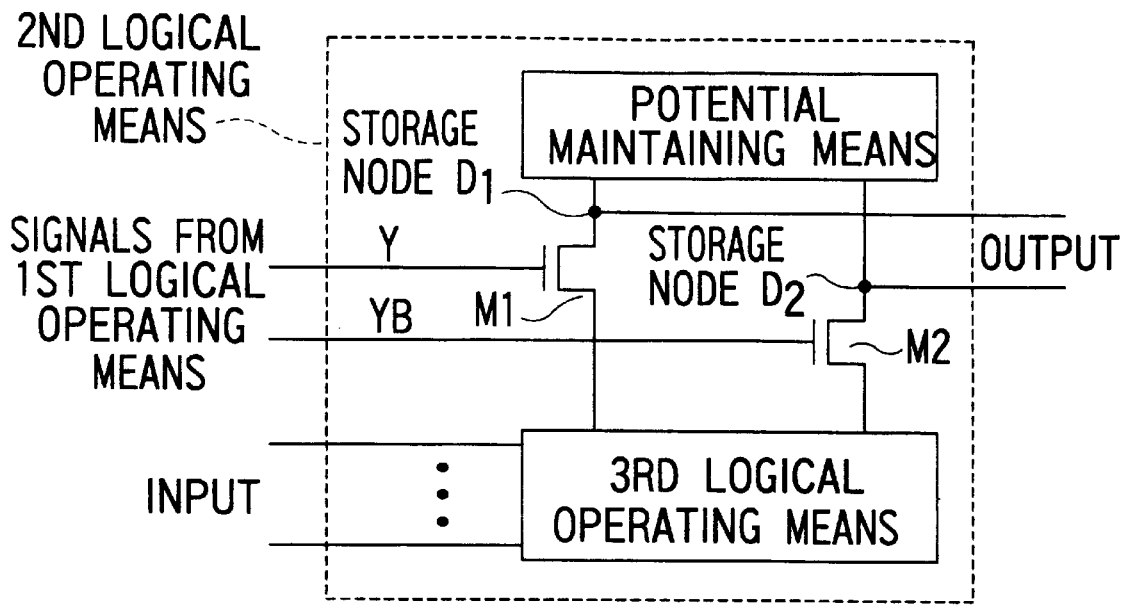
FIG. 7 is a schematic block diagram showing a third modification of the second logical arithmetic operating means of the logic circuit according to the present invention.

FIG. 7 is a schematic block diagram showing a third modification of the second logical operating means of the logic circuit according to the present invention. In this circuit, when the first logical operating means does not complete the arithmetic operation, the output signals Y and YB of the first logical operating means are at potential 0, so that the arithmetic results of the third logical operating means are disconnected from the two storage nodes $D_1$ and $D_2$, respectively. Therefore, the potentials at the two storage nodes $D_1$ and $D_2$ are held by the function of potential maintaining means, without changing the outputs thereof.

Successively, when the first logical operating means (not shown) completes the arithmetic operation, any one of the outputs Y to YB of the first logical operating means (not shown) is at potential 1. Therefore, any one of the two signal lines for outputting the arithmetic results of the third logical operating means is connected to any one of the two storage nodes $D_1$ and $D_2$ through any one of the two n-channel MOS transistors M1 and M2, so that the output thereof changes. Here, in response to the potential changed by this operation at the storage node, the potential maintaining means changes the potential at the storage node connected to the non-conductive n-channel transistor to the potential opposite to that connected to the conductive n-channel transistor. Further, when the first logical operating means (not shown) shifts the incompletion status of the arithmetic operation, since the two transistors M1 and M2 are non-conductive, the two storage nodes $D_1$ and $D_2$ are disconnected from the third logical operating means, so that the values are maintained by the function of the potential maintaining means.

Figure 8:
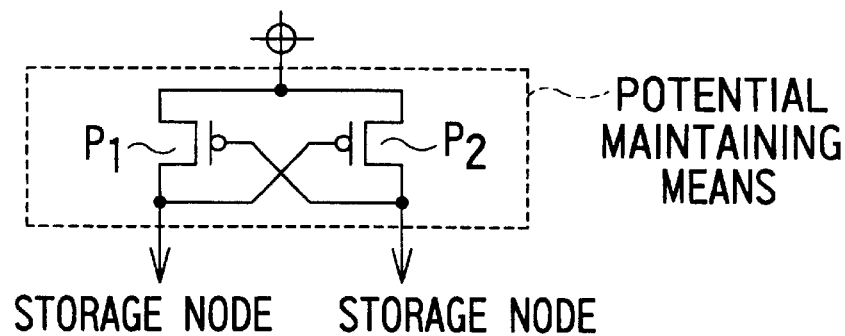
FIG. 8 is a schematic block diagram showing a first practical example of potential maintaining means used for the second logical operating means shown in FIG. 7.
Figure 9:
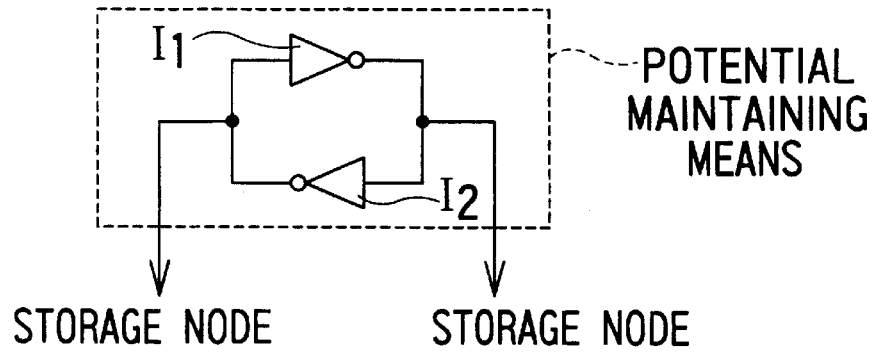
FIG. 9 is a schematic block diagram showing a second practical example of potential maintaining means used for the second logical arithmetic operating means shown in FIG. 7.

FIGS. 8 and 9 are schematic block diagrams showing two different practical circuit examples of the potential maintaining means used for the second logical operating means shown in FIG. 7.

In the potential maintaining means shown in FIG. 8, two p-channel MOS transistors $P_1$ and $P_2$ are provided. The source electrodes of the two p-channel MOS transistors are connected to a supply voltage terminal. Further, the gate electrode of one of the two p-channel MOS transistors is connected to the drain electrode of the other thereof. The respective drain electrodes of the two p-channel MOS transistors form the logical storage nodes $D_1$ and $D_2$ shown in FIG. 7.

In the potential maintaining means shown in FIG. 9, two inverter circuits $I_1$ and $I_2$ are provided. These two inverters constitute a flip-flop circuit by connecting an input terminal of one of the two inverters to an output terminal of the other thereof. The respective input terminals of these two inverters form the logical storage nodes $D_1$ and $D_2$ shown in FIG. 7.

The embodiment of the logic circuit applied to a pipe line construction will be described hereinbelow with reference to FIG. 10.

Figure 10:
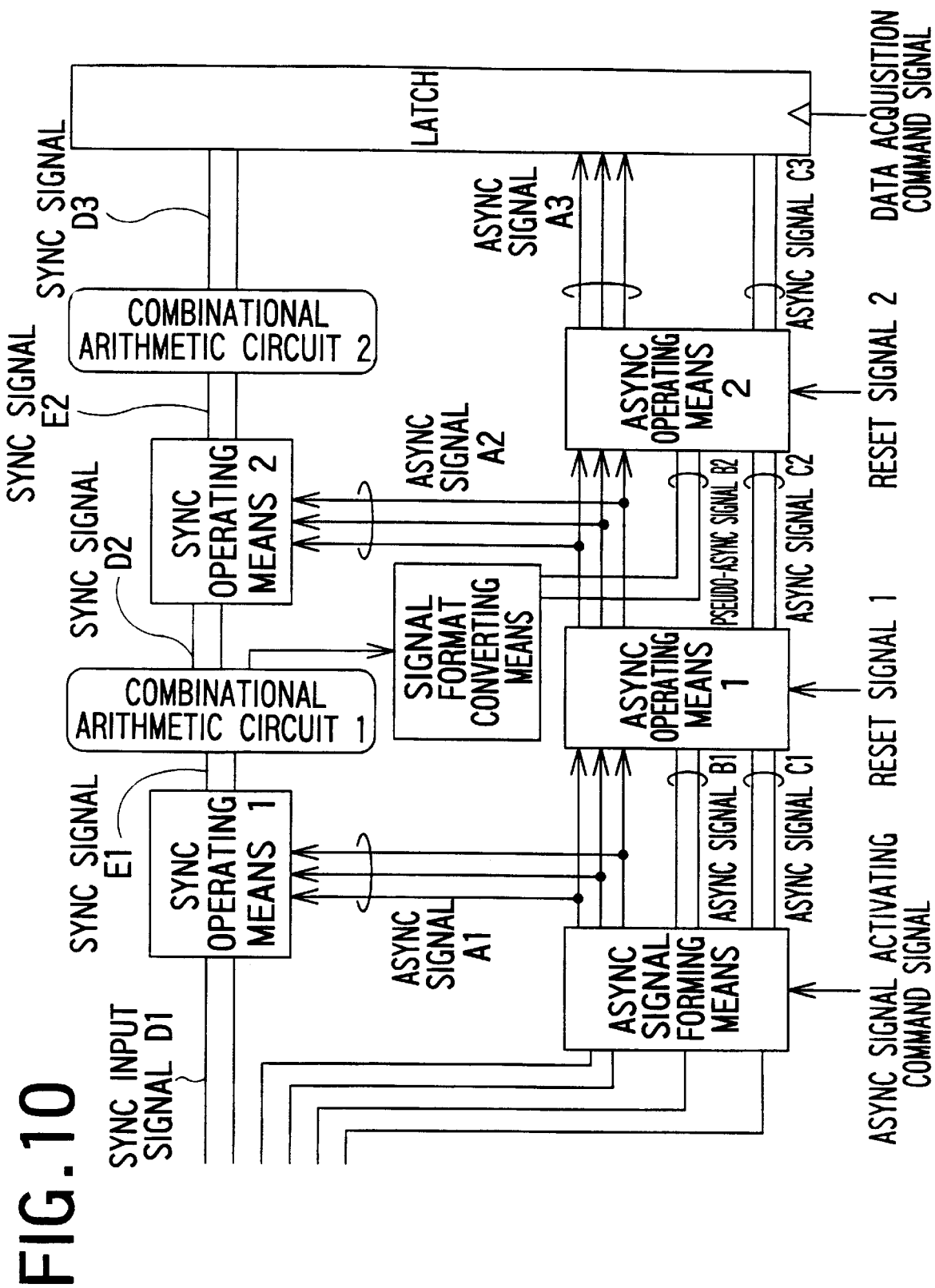
FIG. 10 is a schematic block diagram showing the case where the logic circuit according to the present invention is applied to a pipe line construction.
Figure 18:
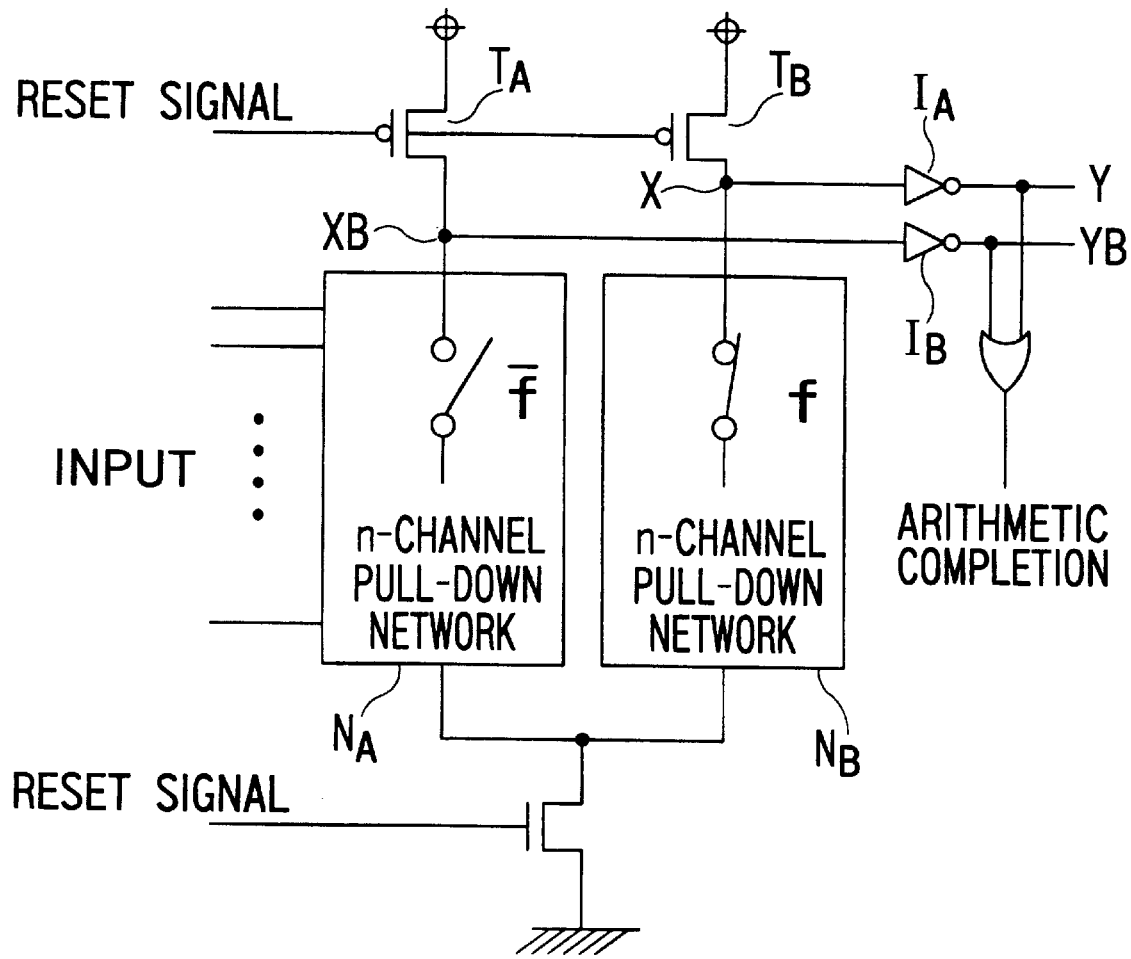
FIG. 18 is a schematic block diagram showing a prior art dynamic type asynchronous logical gate.

FIG. 10 is a schematic block diagram showing the pipe line including the logic circuit according to the present invention. In FIG. 10, first and second asynchronous operating means 1 and 2 correspond to the first logical operating means shown in FIG. 1. These first and second asynchronous operating means 1 and 2 are so constructed that valid outputs can be generated only after all the asynchronous input signals A1 and A2 have been decided. Further, as the asynchronous circuit, a dynamic circuit as shown in FIG. 18 can be considered. In more detail, in the asynchronous circuit, one bit signal is represented by use of two signal lines of positive logic and negative logic (opposite to the positive logic). As a result, the input signals applied to the dynamic asynchronous circuit must be inverted in logical value, respectively. In FIG. 10, the first and second combinational arithmetic circuits 1 and 2 are of ordinary static type logic circuit. Further, the first and second synchronous operating means 1 and 2 are each provided with such a function as to correspond to that of the second logical operating means shown in FIG. 1. Each of the first and second synchronous operating means 1 and 2 transmits each of the arithmetic results to each outputs thereof or holds each preceding values, respectively according to the validity of each of first and second asynchronous signals A1 and A2.

Figure 11:
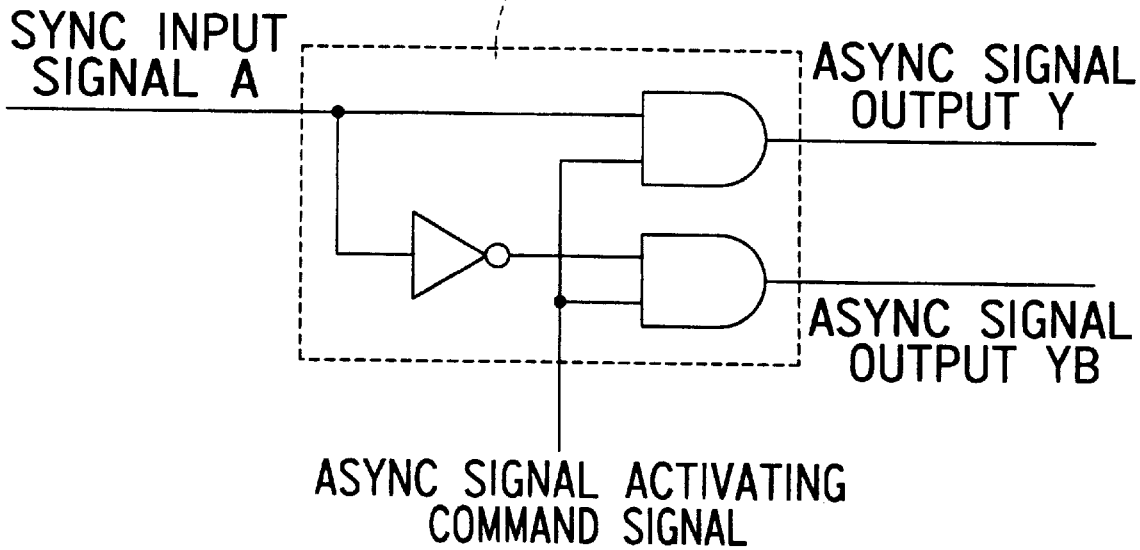
FIG. 11 is a schematic block diagram showing an example of asynchronous signal forming means of the construction shown in FIG. 10.

The arithmetic operation can be started definitely, after the synchronous input signal $D_1$ has been decided, by giving an asynchronous signal activating command signal to the asynchronous signal forming means in order to shift asynchronous signals A1, A2 and A3 from an invalid status to a valid status. Here, the asynchronous signal forming means can be constructed as shown in FIG. 11, for example.

Figure 12:
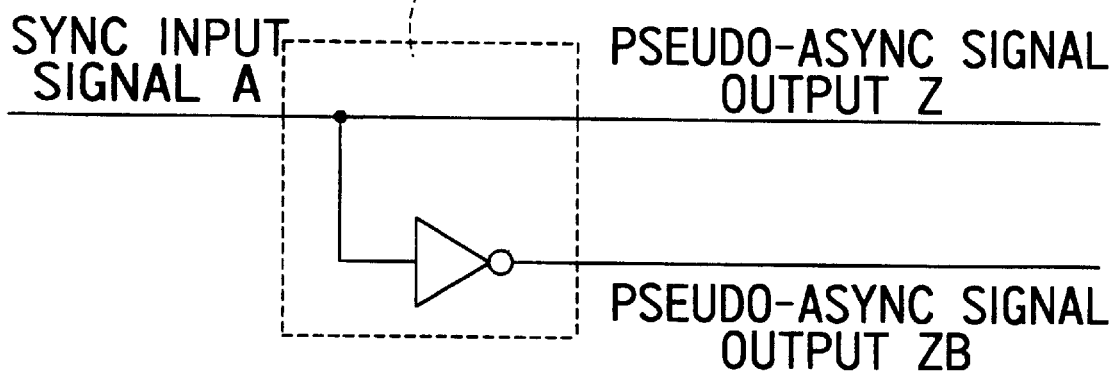
FIG. 12 is a schematic block diagram showing an example of signal format converting means shown in FIG. 10.

In contrast with this, the signal output of the first combinational logic circuit 1 shown in FIG. 10 is outputted by the signal format converting means as a pseudo-asynchronous signal B2. This signal format converting means can be constructed by a simple inverter as shown in FIG. 12. In more detail, the signal format converting means simply forms a complementary signal required as an input signal format of the dynamic asynchronous circuit, without having any function for setting both the positive logic and the negative logic to potential 0 in order to represent the logical non-decision.

In other words, the signal generated by the signal format converting means constructed as shown in FIG. 12 is always valid as the signal inputted to the asynchronous circuit. Therefore, it is necessary to design the operation timing of the circuit, in such a way that the second asynchronous operating means 2 operative in response to the pseudo-asynchronous signal B2 can be operated normally.

Figure 13:
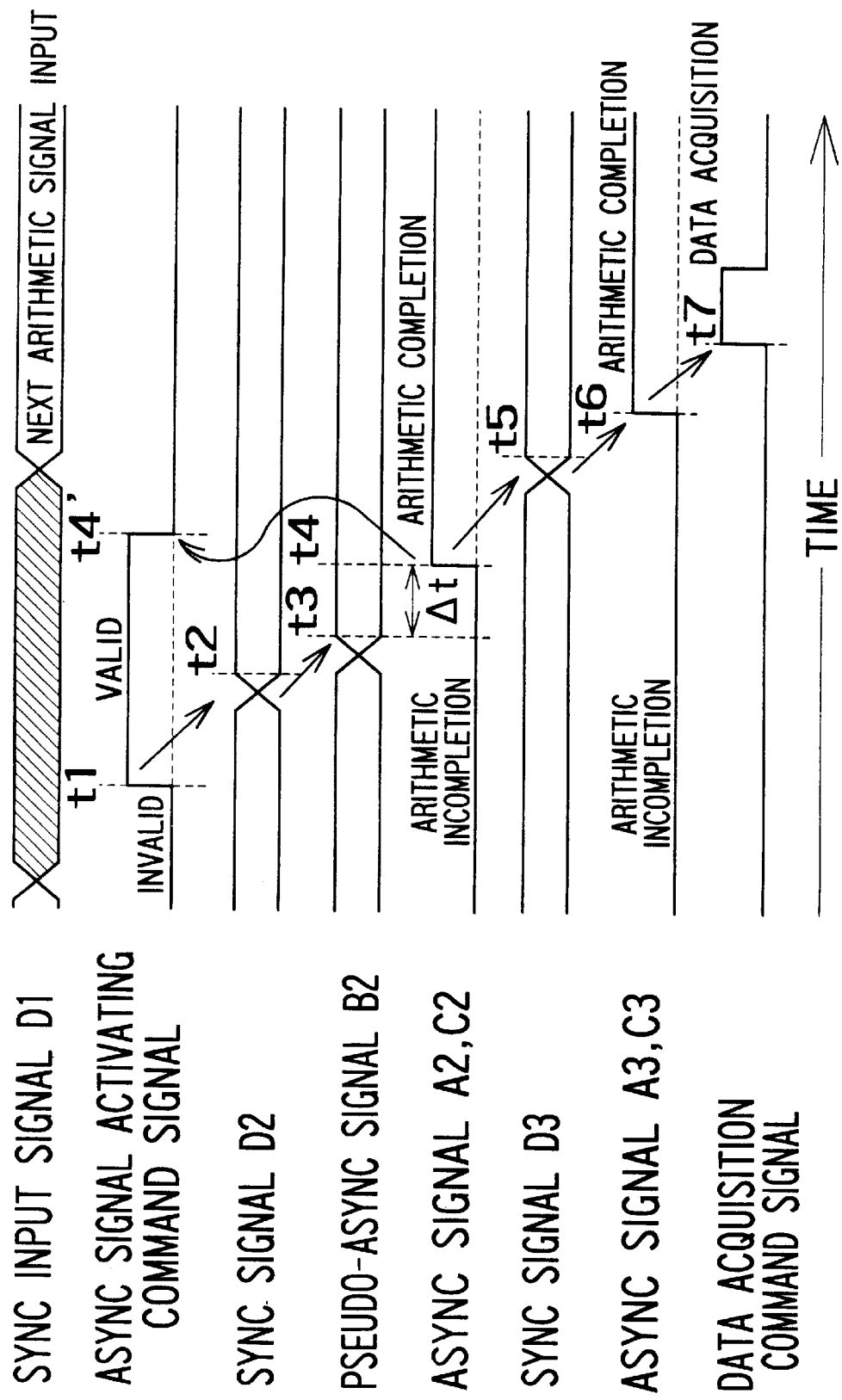
FIG. 13 is a timing chart for securing a smooth operation of the circuit shown in FIG. 10.

FIG. 13 is a timing chart for executing a secure operation of the circuit shown in FIG. 10.

At the beginning of the arithmetic operation, the first and second reset signals 1 and 2 are applied to the first and second asynchronous operating means 1 and 2 as shown in FIG. 10, so that the first and second asynchronous operating means 1 and 2 are both set to the incompletion status of the arithmetic operations thereof. Further, when the asynchronous signal activating command signal is set invalid, three asynchronous signals A1, B1 and C1 are set to the status for representing the incompletion of the arithmetic operation, respectively.

In operation, first the two first and second reset signals 1 and 2 are both removed, and the synchronous input signal D1 is decided.

Successively, as shown in FIG. 13, the asynchronous signal activating command signal is applied to set the three asynchronous signals A1, B1 and C1 valid, so that the arithmetic operations of the first asynchronous operating means 1 and the first synchronous operating means 1 can be both started simultaneously. Here, the assumption is made that the calculation time T1 of the first asynchronous operating means 1 is longer than a sum total operation delay time of the first synchronous operating means 1, the first combinational logic circuit 1 and the signal format converting means. Then, at the time point when the arithmetic operation of the second asynchronous operating means 2 is started (i.e., at a time t4 in FIG. 13), the logical value of the pseudo-asynchronous signal B2 is decided, so that the operation of the second asynchronous operating means 2 is not influenced. As a result, it is unnecessary that the signal format converting means checks the validity of the output signal. Here, upon the completion of the arithmetic operation of the first asynchronous operating means 1, the asynchronous signals A1, B1 and C1 are set invalid by setting the asynchronous signal activating command signal invalid, for the succeeding data arithmetic operation. In this case, since the first synchronous operating means 1 holds the preceding arithmetic results on the basis of the invalidity of the asynchronous signal A1, it is possible to allow the synchronous input signal D1 to be changed.

Successively, the second asynchronous operating means 2, the second synchronous operating means 2, and the second combinational arithmetic circuit 2 execute the arithmetic operation, respectively. Further, when the outputs thereof have been decided, a data acquisition signal is applied to a latch circuit, so that the data can be latched by the latch circuit.

Here, when the arithmetic time of the second asynchronous operating means 2 is longer than an addition of those of the second synchronous operating means 2 and the second combinational operating circuit 2, it is possible to generate the data acquisition signal automatically, by obtaining the arithmetic operation completion signal on the basis of the output signal of the second asynchronous operating means 2 by use of the circuit as shown in FIG. 18. Further, when the first reset signal 1 is generated on the basis of this arithmetic operation completion signal, since the output of the first asynchronous operating means 1 becomes invalid and thereby the output of the second combinational arithmetic circuit 2 can be held, the final output results D3, A3, and C3 are not influenced. In other words, it is possible to prepare the succeeding stage for processing the succeeding data, before the data are acquired by the latch circuit. Therefore, when the assembly of the asynchronous operating means and the synchronous operating means is added to the circuit construction shown in FIG. 10, it is possible to autonomously form the reset signal and thereby to eliminate the time loss due to the calculation time required for resetting. This operation can be considered as an extension of the zero-overhead self-timed circuit as disclosed in the aforementioned document. In other words, conventionally although it has been difficult to provide a part of the synchronous circuit within the logic circuit, in the case of the present invention, it is possible to couple the asynchronous (self-timed circuit) with the synchronous circuit, by restricting calculation timing under a predetermined condition.

As described above, in the logic circuit according to the present invention, since the critical path where a long calculation time is required is constructed by the asynchronous operating means and further the remaining portion is constructed by the synchronous circuits, it is possible to reduce the current consumption, as compared with when all the circuits are constructed by the asynchronous circuits. In addition, the synchronous circuits can start the arithmetic operation immediately after data necessary for arithmetic operation have arrived, it is possible to eliminate wasteful operation and thereby to further reduce the power consumption. For instance, if the circuit as shown in FIG. 10 is perfectly constructed by static synchronous circuits, it is impossible to adopt such a method that after the completion of the arithmetic operation has been detected, only the necessary arithmetic operation is executed. Therefore, in this case, at the stage where the synchronous signal D1 is first given, a high speed signal path of D1–E1–D2–E2–D3 is activated once. After that, the critical path of (A1, B1, C1)–(A2, B2, C2)–(A3, C3) is activated for arithmetic operation. That is, since the path of E2 and D3 must be further evaluated, a wasteful power is inevitably consumed.

As described above, in the logic circuit according to the present invention, it is possible to reduce the power consumption, without sacrificing the high speed operation, by constructing the critical path of the arithmetic operation by the dynamic asynchronous circuits and by constructing the remaining portion by the synchronous circuits. In addition, in the static synchronous circuit, since it is not necessarily required to use two wires to represent one bit signal, it is possible to reduce the wiring quantity and thereby the chip area.

The case where the present invention is applied to a ring-coupled asynchronous and/or synchronous mixing circuit is described hereinbelow.

Figure 14:
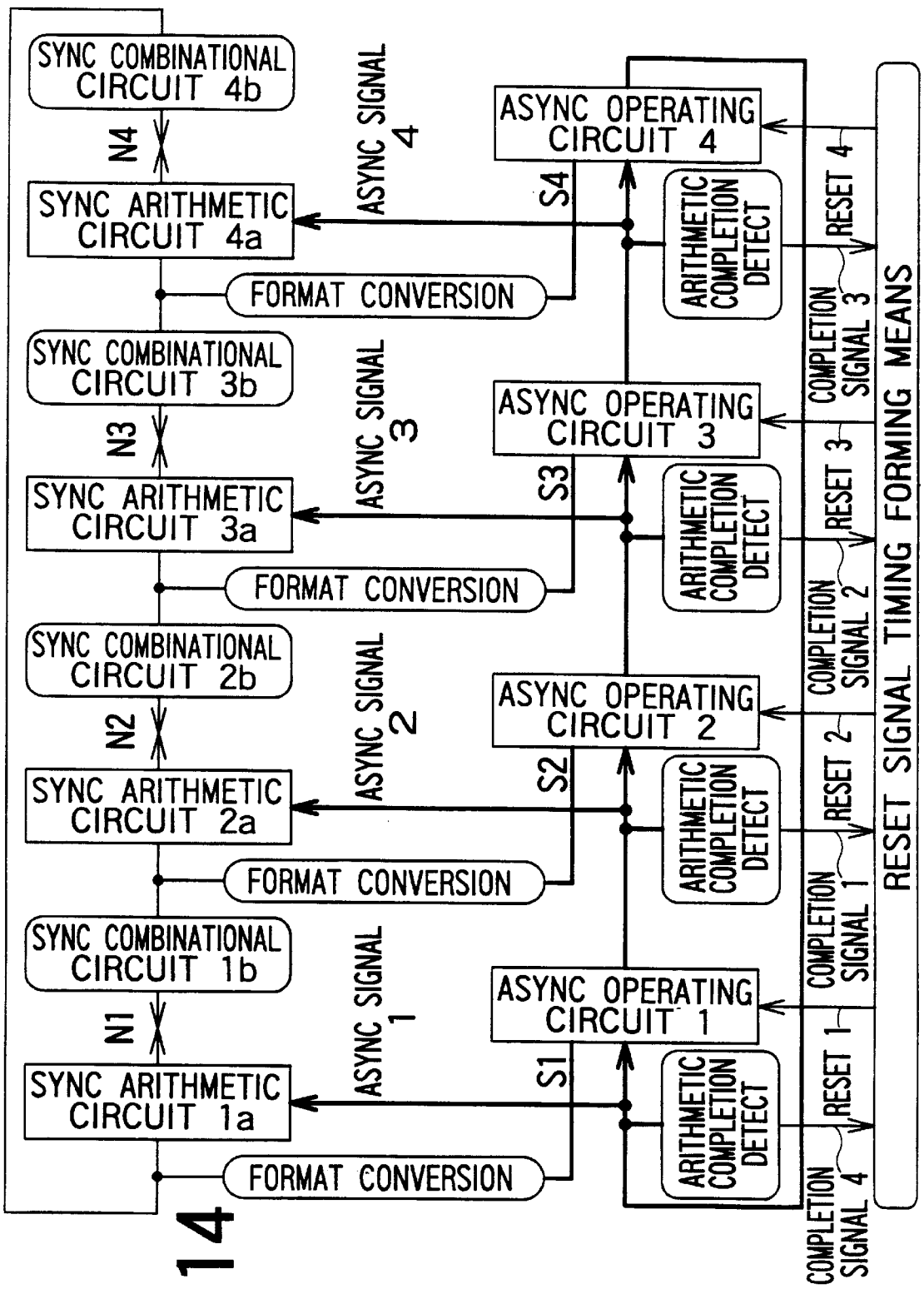
FIG. 14 is a schematic block diagram showing the construction to which the present invention is applied to asynchronous and/or synchronous circuits coupled to each other in ring shape.

FIG. 14 is a schematic block diagram showing a construction in which the logic circuit according to the present invention is applied to a ring-coupled asynchronous and/or synchronous mixing circuit. In FIG. 14, first to fourth asynchronous arithmetic circuits 1 to 4 correspond to the first logical operating means shown in FIG. 1, and first to fourth synchronous arithmetic circuits 1a to 4a correspond to the second logical operating means shown in FIG. 1. Further, first to fourth combinational logic circuits (synchronous) 1b to 4b and four signal format converting means are additionally connected to the above-mentioned circuit. Here, the first to fourth combinational logic circuits 1b to 4b execute the operations of the arithmetic results of the first to fourth synchronous arithmetic circuits 1a to 4a, respectively. The four signal format converting means execute the format conversions of the arithmetic signals, in order to input the arithmetic results of the first to fourth combinational logic circuits 1b to 4b to the first to fourth asynchronous arithmetic circuits 1 to 4, respectively. Further, four arithmetic completion detecting means are connected to the first to fourth asynchronous arithmetic circuits 1 to 4, respectively, in order to detect each validity of the arithmetic results and further to generate each of the first to fourth completion signals 1 to 4 to a reset timing signal forming means, respectively. Further, the reset signal timing forming means for controlling the resetting of the first to fourth asynchronous arithmetic circuits 1 to 4 is connected to the first to fourth asynchronous arithmetic circuits 1 to 4, respectively. The reset signal timing forming means controls as to whether these four asynchronous arithmetic circuits 1 to 4 must be reset or not by supplying first to fourth resetting signals 1 to 4 thereto on the basis of the completion signals 1 to 4, respectively.

Here, the reset signal timing forming means operates on the basis of the principle of the zero-overhead self-timed circuit as disclosed in the afore-mentioned document as follows: First, when the completion signal is formed by an asynchronous arithmetic circuit, the arithmetic result obtained by the asynchronous arithmetic circuit connected one stage before the asynchronous arithmetic circuit is no longer necessary. Therefore, this arithmetic circuit is reset, and further the reset status of the asynchronous arithmetic circuit connected one stage before is released for preparation of the succeeding arithmetic operation. In this case, when data proceed forward, since the asynchronous circuit is once reset and then released in sequence, that is, since the asynchronous circuits ready for the arithmetic operation appear in sequence, it is possible to realize a high speed arithmetic operation.

Figure 15:
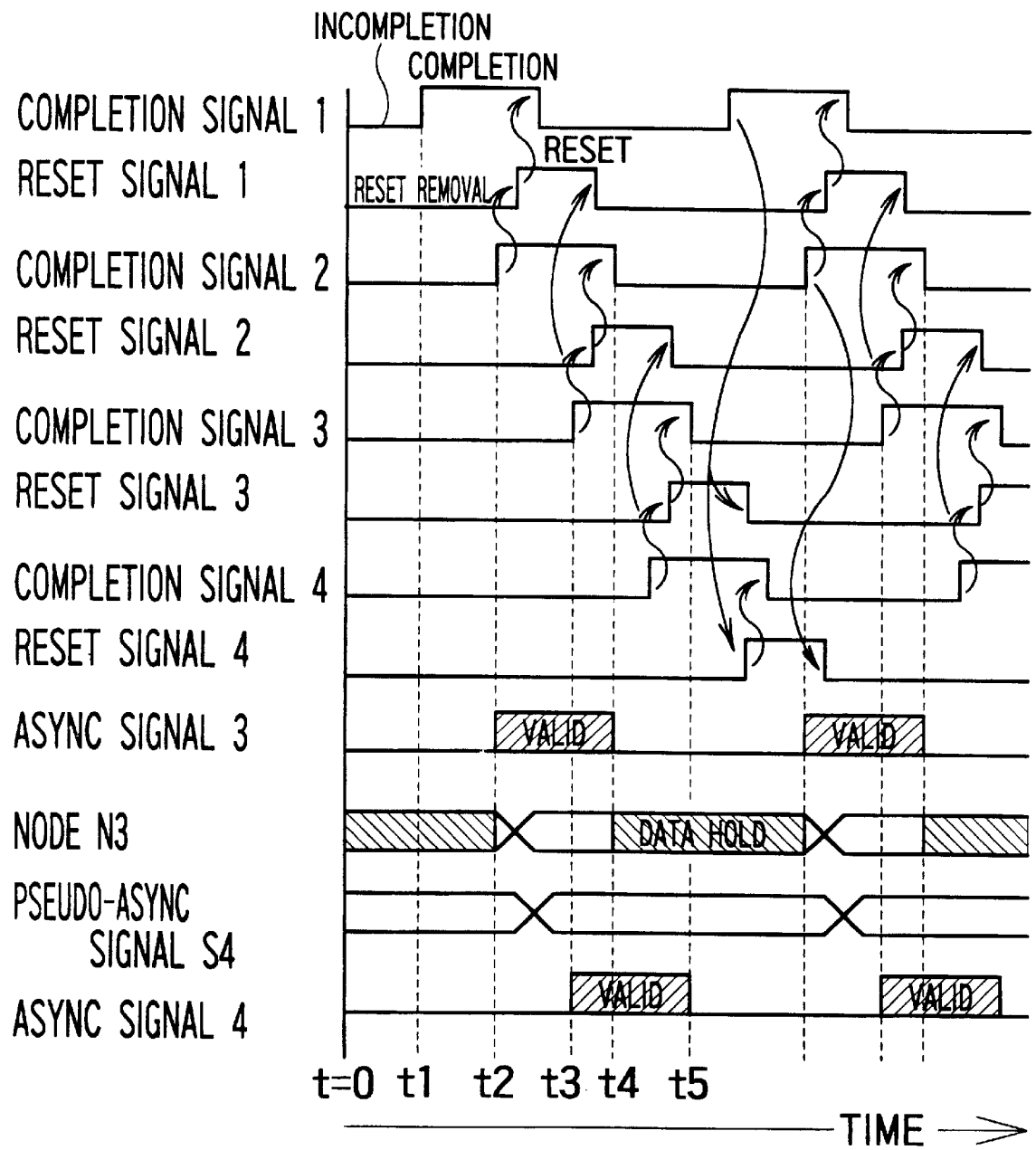
FIG. 15 is a timing chart showing the logic circuit shown in FIG. 14.

The operation of the ring-coupled asynchronous and/or synchronous mixing circuit shown in FIG. 14 will be described hereinbelow with reference to a timing chart shown in FIG. 15.

First, after the asynchronous arithmetic circuit has been once reset at a time point t=0, the reset signal is removed. In this status, as far as a valid asynchronous signal is inputted, the circuit is always ready for arithmetic operation. Further, at this time point, since the logical value at the node N4 is decided on the synchronous circuit side, it is assumed that the pseudo-asynchronous signal S1 has been decided on the basis of this value through the synchronous arithmetic circuit 4b and the signal format converting means.

Successively, when the first asynchronous signal 1 is changed from the invalid status to the valid status at any predetermined time point, the arithmetic operation is started by the first asynchronous arithmetic circuit 1 and the synchronous arithmetic circuit 1a, respectively, so that the arithmetic operation of the first synchronous arithmetic circuit 1 ends at t=t1. Here, although the first asynchronous arithmetic circuit 1 becomes valid and thereby the fourth completion signal 4 is generated essentially, this operation is omitted herein for brevity. Further, the timings at which the reset signal is formed on the basis of the completion signal by the reset signal timing forming means as shown in FIG. 14 are also shown in FIG. 15. Here, the assumption is made that the time required for the first asynchronous arithmetic circuit 1 is longer than a sum total time of the arithmetic operations of the first synchronous arithmetic circuit 1a and the first combinational logic circuit 1b and the signal conversion time of the signal format converting means (the same conditions are applied to the remaining second to fourth asynchronous arithmetic circuits 2 to 4). Further, the case will be considered at the time point t=t2 when the completion signal is formed and thereby the third asynchronous signal 3 becomes valid.

At the time point t=t2, since the third asynchronous signal 3 is valid, the third asynchronous arithmetic circuit 3 starts the arithmetic operation. At the same time, the synchronous arithmetic circuti 3a, the combinational logic circuit 3b and further the signal format converting means start the arithmetic operation in sequence. Here, on the basis of the above-mentioned assumption, since the logical value of the pseudo-asynchronous signal S4 of the signal format converting means has been decided before the time point when the third asynchronous arithmetic circuit 3 completes the arithmetic operation, at the time point (t=t3) when the fourth asynchronous arithmetic circuit 4 starts the arithmetic operation, a consistent asynchronous signal can be inputted to the fourth asynchronous arithmetic circuit 4. In other words, in the dynamic type asynchronous arithmetic circuit, since an input signal is not permitted to be changed during arithmetic operation, the above-mentioned assumption is necessary to prevent the pseudo-asynchronous signal S4 from being changed as described above. Further, after the arithmetic operation has been completed, the signal transition other than the transition to the invalid status is not permitted because an erroneous arithmetic result may be outputted. That is, the fourth pseudo-asynchronous signal S4 must not be changed until a reset signal is applied to at least the fourth asynchronous arithmetic circuit 4.

According to the present invention, when the second asynchronous arithmetic circuit 2 is reset at time point t=t4 and thereby the third asynchronous signal 3 changes to the invalid status, the output of the third synchronous circuit 3a is held, so that the status at the node N3 can be reserved until the valid arithmetic result is outputted from the second asynchronous arithmetic circuit 2. As a result, although the status of the pseudo-asynchronous signal S4 can be reserved, since the reset signal is supplied from the reset signal timing forming means, the fourth asynchronous arithmetic circuit 4 is reset. Therefore, the time point at which the holding of the signal S4 becomes unnecessary is always before the time point at which the third asynchronous signal 3 becomes valid again and thereby the signal S4 changes, so that a stable operation can be secured. Further, in the same way as with the construction shown in FIG. 10, in the synchronous arithmetic circuit system, since new arithmetic operation will not be executed until necessary, the power consumption can be reduced. In addition, since the calculation time of the circuit can be decided by only the asynchronous arithmetic circuits, as far as the above-mentioned conditions can be established, it is possible to form a circuit system which can satisfy both the high speed operation of the asynchronous circuits and the low power consumption of the synchronous circuits at the same time.

The case where the present invention is applied to a division circuit is described hereinbelow.

Figure 16:
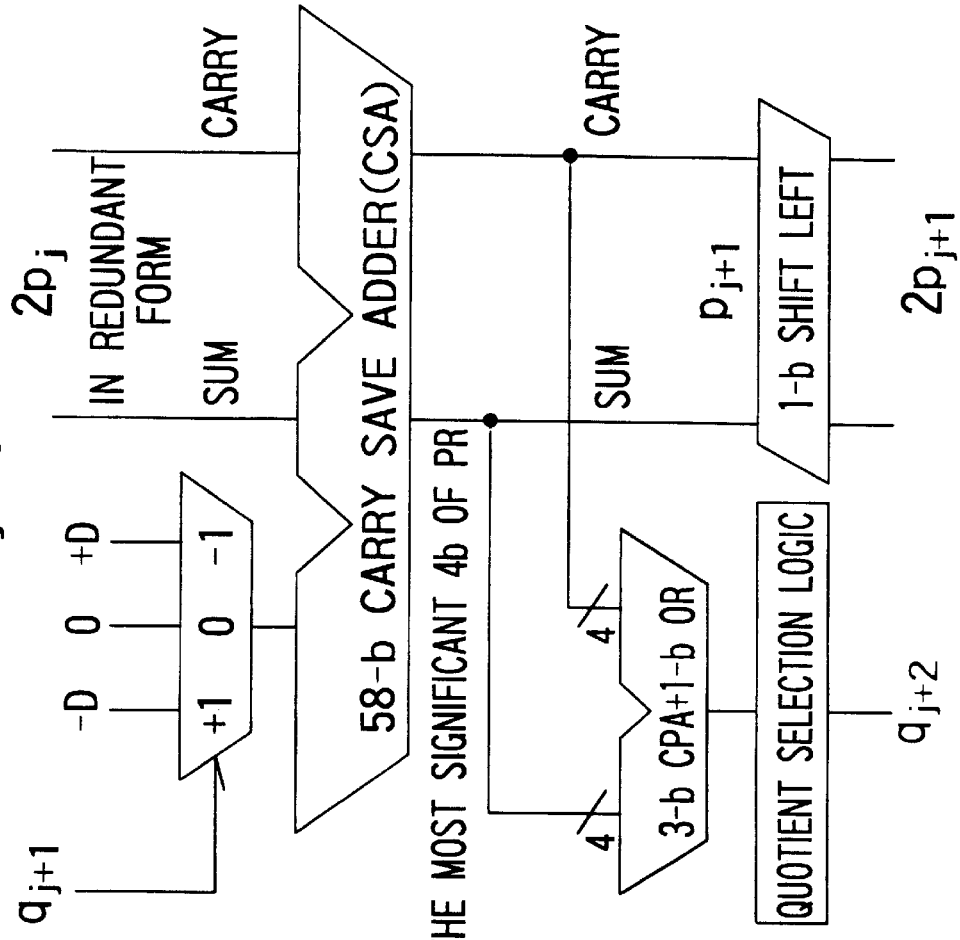
FIG. 16 is a schematic block diagram showing a basic configuration of a radix 2 division stage.

FIG. 16 is a schematic block diagram showing a basic configuration of a radix-2 division stage. In the case of division, the equation of a partial remainder is defined as $$p_{j+1} = 2p_j - q_{j+1} D \qquad (1)$$

where the symbols are defined as follows:

$p_j$ jth partial remainder. ($2p_0$ is a dividend)

$q_j$ jth quotient digit in a signed digit form.

D divisor (normalized in [½,1)).

The quotient digit $q_{j+1}$ is determined to converge the equation (1). As the partial remainder is expressed in a carry save form to accelerate the calculation of the equation (1), the 3-b CPA(carry propagation adder) and 1-b OR circuit in FIG. 16 perform a format translation between a carry save form (redundant form) and a non-redundant form.

Figure 17:
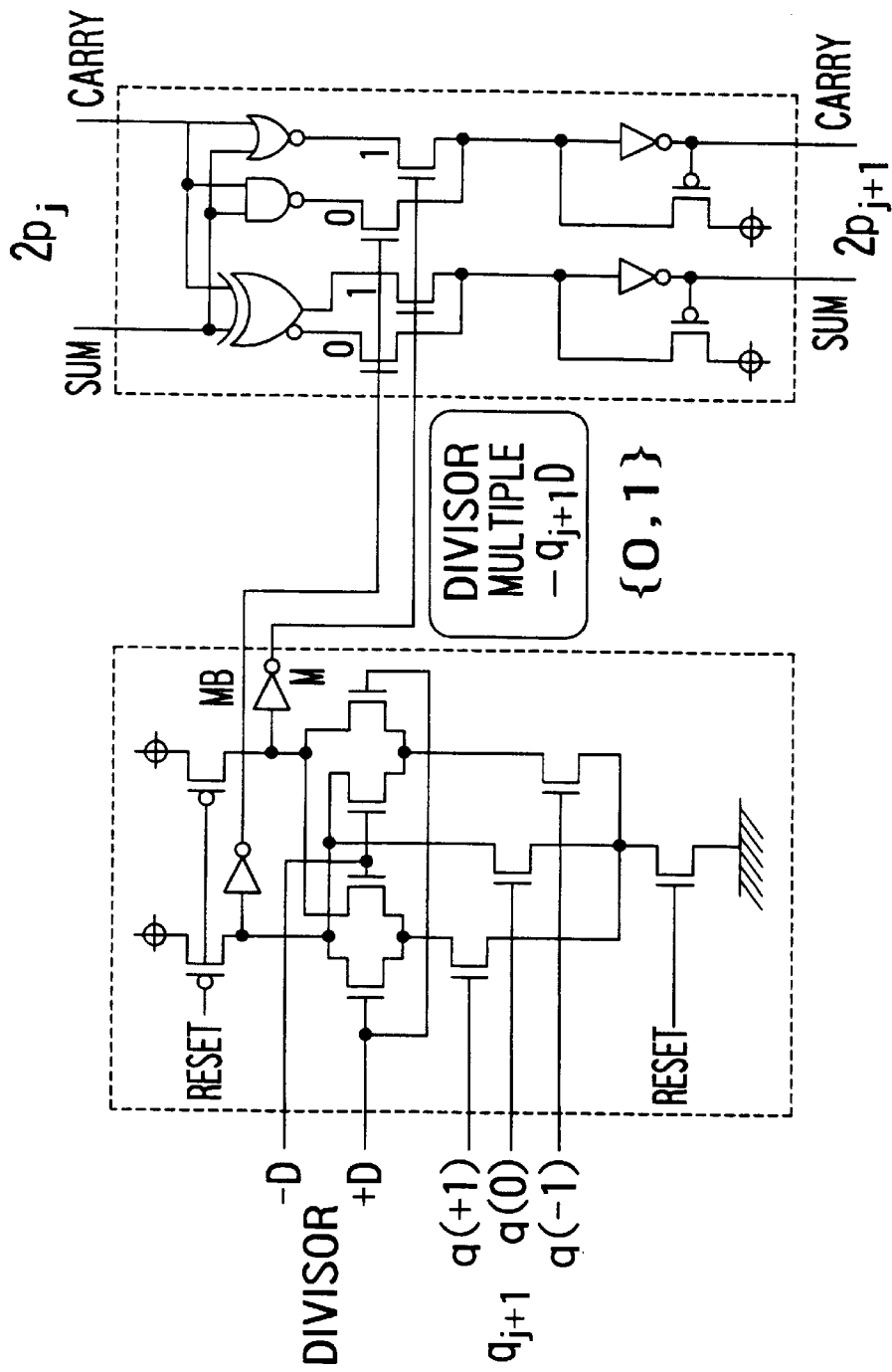
FIG. 17 is a schematic block diagram showing a practical implementation of the partial reminder formation block consisting of the multiple selector and the CSA.

FIG. 17 is a schematic block diagram showing a practical implementation of the partial reminder formation block consisting of the multiple selector and the CSA(carry save adder). To express the quotient digit, the implementation used 3 wires labeled q(+1), q(0) and q(−1) in FIG. 17. The quotient digit is calculated by the quotient selection logic shown in FIG. 16. Since there exists a critical path of the divider, the multiple selector, the most significant 4-b partial remainder formation block, the 3-b CPA, the 1-b OR, and the quotient selection logic are implemented by the asynchronous circuits. These circuits are implemented as the dual-rail dynamic differential cascode voltage switch logic (DCVSL) circuit. The CSA circuit consists of the proposed selector circuit described in FIG. 4 which has a small number of static logic gates. After the multiple signals M and MB are determined, the CSA circuit calculates the next partial reminder $p_{j+1}$ without spurious transitions if the $p_j$ has been determined sufficiently before the arrival of the multiple signals.

The above described circuits has an asynchronous pipeline scheme that combines a low power static circuit with a high-speed dual-rail dynamic circuit. The scheme utilizes dual-rail circuit only in the critical path of an division unit. The proposed implementation of the calculation unit reduced power consumption by more than ½ of the full-dynamic implementation while maintaining the calculation speed. Because of the elimination of spurious transitions, the proposed implementation showed even less power consumption over synchronous static circuit implementation. By using 0.3 μm triple metal CMOS technology, the calculation time of floating point 56-b full mantissa division and square root is expected to be 45 ns in the worst case.

What is claimed is:

1. A logic circuit for representing logical values on the basis of high and low voltages, respectively, comprising:

first logical operating means having n-units (where n is an integer larger than one) and m-units (where m is an integer larger than one) of output wires for outputting first logical operating results by transmitting any one of a first logical level and a second logical level according to a high voltage or a low voltage; when all the logical levels of n-units of the output wires are at the first logical level, said first logical operating means undeciding logical operation results, but when any one of the n-units of the output wires is at the second logical level different from the first logical level, said first logical operating means deciding the first logical operation results on the basis of an output value corresponding to the output wire of the second logical level;

second logical operating means for inputting signals transmitted through the n-units of the output wires and for outputting second logical operation results; when said first logical operating means undecides the logical operation results, said second logical operating means holding the second logical operation results, but when the first logical operation results are decided at a certain value, said second logical operating means outputting the second logical operation results corresponding to the decided value; and third logical operating means for inputting signals transmitted through the m-units of the output wires from said first logical operating means and for outputting third technical operation results to logical operating means other than said second logical operating means, wherein signals from said first logical operating means do not interact with signals from said second operating logical means so that a signal path from said second operating means may not have a longer calculation time than a path from said first logical operating means.

2. The logic circuit of claim 1, wherein said first logical operating means comprises asynchronous signal forming means for converting input logical signals of any predetermined form into a logical signal form required by said second logical operating means in synchronism with a command of signalling means for commanding operation start.

3. The logic circuit of claim 1, wherein said second logical operating means comprises n-units of n-channel MOS transistors;

said n-units of the output wires of said first logical operating means being connected to gate electrodes of n-units of said n-channel MOS transistors, respectively in such polarity that a logical value indicative of operation completion is at "1"; and all drain electrodes of n-units of said n-channel MOS transistors being connected to a junction point, and a logical value of an input signal applied to a source electrode of said n-channel MOS transistor of said second logical operating means selected according to the logical operation results of said first logical operating means being selected and outputted to the junction point.

4. The logic circuit of claim 3, wherein said first logical operating means comprises asynchronous signal forming means for converting input logical signals of any predetermined form into a logical signal form required by said second logical operating means in synchronism with a command of signalling means for commanding operation start.

5. The logic circuit of claim 1, wherein said second logical operating means comprises n-units of p-channel MOS transistors;

n-units of the output wires of said first logical operating means being connected to gate electrodes of the n-units of said p-channel MOS transistors, respectively in such polarity that a logical value indicative of operation completion is at "0"; and all drain electrodes of n-units of said p-channel MOS transistors being connected to a junction point, and a logical value of an input signal applied to a source electrode of said p-channel MOS transistor of said second logical operating means selected according to the logical operation results by said first logical operating means being selected and outputted to the junction point.

6. The logic circuit of claim 5, wherein said first logical operating means comprises asynchronous signal forming means for converting input logical signals of any predetermined form into a logical signal form required by said second logical operating means in synchronism with a command of signalling means for commanding operation start.

7. The logic circuit of claim 1, wherein said second logical operating means comprises n-units of transistor pairs such that drain electrodes and source electrodes of n-units of p-channel MOS transistors being connected to drain electrodes and source electrodes of n-units of n-channel MOS transistors, respectively;

the logical operation results obtained by n-units of the output wires of said first logical operating means being inputted to gate electrodes of the p-channel MOS transistors of said transistor pairs in such polarity that a logical value indicative of operation completion is at "0";

the logical operation results obtained by n-units of the output wires of said first logical operating means being inputted to gate electrodes of the n-channel MOS transistors of said transistor pairs in such polarity that a logical value indicative of operation completion is at "1"; and all drain electrodes of n-units of said transistor pairs being connected to a junction point, and a logical value of an input signal applied to a source electrode of said transistor pairs of said second logical operating means selected according to the logical operation results by said first logical operating means being selected and outputted to the junction point.

8. The logic circuit of claim 7, wherein said first logical operating means comprises asynchronous signal forming means for converting input logical signals of any predetermined form into a logical signal form required by said second logical operating means in synchronism with a command of signalling means for commanding operation start.

9. The logic circuit of claim 1, wherein said second logical operating means comprises:

two logic storage nodes;

two n-channel MOS transistors having drain electrodes connected to said two logic storage nodes, respectively and gate electrodes connected to the output wires of said first logical operating means, respectively;

potential maintaining means connected between said two logic storage nodes, for maintaining a node potential when the node potentials do not change but for setting an unchanged node potential to a potential complementary to a changed node potential when any one of the node potentials changes; and third logical operating means for applying potentials decided by input signals other than the signals input by said first logical operating means, to the source electrodes of said two n-channel MOS transistors.

10. The logic circuit of claim 9, wherein said first logical operating means comprises asynchronous signal forming means for converting input logical signals of any predetermined form into a logical signal form required by said second logical operating means in synchronism with a command of signalling means for commanding operation start.

11. The logic circuit of claim 9, wherein said potential maintaining means are two p-channel MOS transistors having source electrodes connected to a supply voltage, a gate electrode of the one p-channel MOS transistor being connected to a drain of the other p-channel MOS transistor mutually, the drain electrodes thereof forming the two logic storage nodes, respectively.

12. The logic circuit of claim 11, wherein said first logical operating means comprises asynchronous signal forming means for converting input logical signals of any predetermined form into a logical signal form required by said second logical operating means in synchronism with a command of signalling means for commanding operation start.

13. The logic circuit of claim 9, wherein said potential maintaining means are two inverter circuits, an input terminal of one inverter circuit being connected to an output terminal of the other inverter circuit mutually, the input terminals thereof forming the two logic storage nodes, respectively.

14. The logic circuit of claim 13, wherein said first logical operating means comprises asynchronous signal forming means for converting input logical signals of any predetermined form into a logical signal form required by said second logical operating means in synchronism with a command of signalling means for commanding operation start.

15. A logic circuit for representing a logical value on the basis of high and low voltages, comprising:

first logical operating means having n-units (where n is an integer larger than one) and m-units (where m is an integer larger than one) of output wires for outputting first logical operation results by transmitting any one of a first logical level and a second logical level according to a high voltage and a low voltage; when all the logical levels of n-units of the output wires are at the first logical level, said first logical operating means undeciding logical operation results, but when any one of n-units of the output wires is at the second logical level different from the first logical level, said first logical operating means deciding the first logical operation results on the basis of an output value corresponding to the output wire of the second logical level;

second logical operating means for inputting signals transmitted through u-units of the output wires and for outputting second logical operation results; when said first logical operating means undecides the logical operation results, said second logical operating means holding the second logical operation results, but when the first logical operation results are decided at a value, said second logical operating means outputting the second logical operation results corresponding to the decided value; and third logical operating means for inputting signals transmitted through the m-units of the output wires from said logical operating means and for outputting third logical operation results to logical operating means other than said second logical operating means, signals from said first logical operating means not interacting with signals from said second operating means logical means so that a signal path from said second operating means may not have a longer calculation time than a path from said first logical operating means, wherein said first logical operating means comprises:

n-units of nodes C corresponding to n-units of the output wires;

n-units of p-channel MOS transistors for connecting n-units of the nodes C to a supply voltage;

logic resetting means for undeciding the logical operation results of said first logical operating means by setting all logical levels of the output wires so constructed as to be influenced by the potentials at the nodes C to the first logical level, by charging potential levels at the nodes C to "1" when gate potential levels of said p-channel MOS transistors are at "0" level;

logical evaluating means having n-channel MOS transistor network connected to n-units of the nodes C, for changing the potentials at the nodes C to "0" by discharging any one of the nodes in response to a signal inputted to said first logical operating means; and means for representing a decision of the first logical operation results by changing the logical level of the output wire corresponding to the node having a potential of "0" to the second logical level.

16. The logic circuit of claim 15, wherein said second logical operating means comprises n-units of n-channel MOS transistors;

n-units of the output wires of said first logical operating means being connected to gate electrodes of n-units of said n-channel MOS transistors, respectively in such polarity that a logical value indicative of operation completion is at "1"; and all drain electrodes of n-units of said n-channel MOS transistors being connected to a junction point, and a logical value of an input signal applied to a source electrode of said n-channel MOS transistor of said second logical operating means selected according to the logical operation results of said first logical operating means being selected and outputted to the junction point.

17. The logic circuit of claim 15, wherein said second logical operating means comprises n-units of p-channel MOS transistors;

n-units of the output wires of said first logical operating means being connected to gate electrodes of n-units of said p-channel MOS transistors, respectively in such polarity that a logical value indicative of operation completion is at "0"; and all drain electrodes of n-units of said p-channel MOS transistors being connected to a junction point, and a logical value of an input signal applied to a source electrode of said p-channel MOS transistor of said second logical operating means selected according to the logical operation results by said first logical operating means being selected and outputted to the junction point.

18. The logic circuit of claim 15, wherein said second logical operating means comprises n-units of transistor pairs such that drain electrodes and source electrodes of n-units of p-channel MOS transistors being connected to drain electrodes and source electrodes of n-units of n-channel MOS transistors, respectively;

the logical operation results obtained by n-units of the output wires of said first logical operating means being inputted to gate electrodes of the p-channel MOS transistors of said transistor pairs in such polarity that a logical value indicative of operation completion is at "0";

the logical operation results obtained by n-units of the output wires of said first logical operating means being inputted to gate electrodes of the n-channel MOS transistors of said transistor pairs in such polarity that a logical value indicative of operation completion is at "1"; and all drain electrodes of n-units of said transistor pairs being connected to a junction point, and a logical value of an input signal applied to a source electrode of said transistor pairs of said second logical operating means selected according to the logical operation results by said first logical operating means being selected and outputted to the junction point.

19. The logic circuit of claim 15, wherein said second logical operating means comprises:

two logic storage nodes;

two n-channel MOS transistors having drain electrodes connected to said two logic storage nodes, respectively and gate electrodes connected to the output wires of said first logical operating means, respectively;

potential maintaining means connected between said two logic storage nodes, for maintaining a node potential when the node potentials do not change but for setting an unchanged node potential to a potential complementary to a changed node potential when any one of the node potentials changes; and third logical operating means for applying potentials decided by input signals other than the signals inputted by said first logical operating means, to the source electrodes of said two n-channel MOS transistors.

20. A logic circuit composed of a plurality of cascade-connected logic circuit units for processing inputted logical signals by use of a plurality of operating means, wherein;

each of a plurality of said logic circuit units for representing logical values on the basis of high and low voltages comprises:

first logical operating means having n-units (where n is an integer larger than one) and m-units (where m is an integer larger than one) of output wires for outputting first logical operation results by transmitting any one of a first logical level and a second logical level according to a high voltage and a low voltage; when all the logical levels of n-units of the output wires are at the first logical level, said first logical operating means undeciding logical operation results, but when any one of n-units of the output wires is at the second logical level different from the first logical level, said first logical operating means deciding the first logical operation results on the basis of an output value corresponding to the output wire of the second logical level;

second logical operating means for inputting signals transmitted through n-units of the output wires and for outputting second logical operation results; when said first logical operating means undecides the logical operation results, said second logical operating means holding the second logical operation results, but when the first logical operation results are decided at a value, said second logical operating means outputting the second logical operation results corresponding to the decided value; and third logical operating means for inputting signals transmitted through the m-units of the output wires from said logical operating means and for outputting third logical operation results to logical operating means-other than said second logical operating means, signals from said first logical operating means do not interacting with signals from said second operating logical means so that a signal path from said second operating means may not have; a longer calculation time than a path from said first logical operating means, wherein said first logical operating means of the first stage logic circuit unit of the logic circuit comprises asynchronous signal forming means for converting input logical signals of any predetermined form into a logical signal form required by said second logical operating means in synchronism with a command of signaling means for commanding operation start.

21. A logic circuit composed of a plurality of ring-connected logic circuit units for performing iterative operations a predetermined number of times, wherein;

each of a plurality of the logic circuit units for representing logical values on the basis of high and low voltages comprises:

first logical operating means having n-units (where n is an integer larger than one) and m-units (where m is an integer larger than one) of output wires for outputting first logical operation results by transmitting any one of a first logical level and a second logical level according to a high voltage and a low voltage; when all the logical levels of n-units of the output wires are at the first logical level, said first logical operating means undeciding logical operation results, but when any one of n-units of the output wires is at the second logical level different from the first logical level, said first logical operating means deciding the first logical operation results on the basis of an output value corresponding to the output wire of the second logical level;

second logical operating means for inputting signals transmitted through n-units of the output wires and for outputting second logical operation results; when said first logical operating means undecides the logical operation results, said second logical operating means holding the second logical operation results, but when the first logical operation results are decided at a value, said second logical operating means outputting the second logical operation results corresponding to the decided value; and third logical operating means for inputting signals transmitted through the m-units of the output wires from said logical operating means and for outputting third logical operation results to logical operating means other than said second logical operating means, signals from said first logical operating means not interacting with signals from said second operating logical means so that a signal path from said second operating-means may not have a longer calculation time than a path from said first logical operating means, wherein said logic circuit further comprises:

operation completion detecting means for detecting operation completion signals of the output wires of said first logical operating means; and reset signal forming means for requesting a reset for the logic circuit unit stage related to formation of an input signal applied to the logic circuit unit stage whose operation has been completed by use of the operation completion signal and for requesting a reset release for the already reset logical operating means.

* * * * *